(12) United States Patent
Petitpierre et al.

(10) Patent No.: US 6,172,880 B1
(45) Date of Patent: Jan. 9, 2001

(54) FACEPLATE FOR AN ELECTRONIC CIRCUIT CARD FOR REDUCING EMI EMISSIONS BETWEEN CIRCUIT CARDS INSERTED IN A CIRCUIT CARD HOUSING

(75) Inventors: Eric M. Petitpierre, Purcellville; James H. Durham, Reston, both of VA (US)

(73) Assignee: Hubbell Incorporated, Orange, CT (US)

( * ) Notice: Under 35 U.S.C. 154(b), the term of this patent shall be extended for 0 days.

(21) Appl. No.: 09/126,732

(22) Filed: Jul. 31, 1998

(51) Int. Cl.$^7$ ..................................................... H05K 7/14
(52) U.S. Cl. .......................... 361/801; 361/752; 361/754; 361/756; 361/759; 361/800; 361/802; 361/825; 361/816; 361/818; 439/116; 439/117; 439/118; 439/119; 439/136; 439/137; 439/157
(58) Field of Search .................................... 361/754, 752, 361/756, 759, 800, 801, 802, 825; 439/116–119, 136–140, 157

(56) References Cited

U.S. PATENT DOCUMENTS

| 3,276,560 | 10/1966 | Wirtz | 400/156.1 |
| 3,469,015 | 9/1969 | Warren | 174/35 GC |

(List continued on next page.)

FOREIGN PATENT DOCUMENTS

| 2844576 | 4/1980 | (DE) . |
| 3211758 | 6/1983 | (DE) . |

(List continued on next page.)

OTHER PUBLICATIONS

D. Eaby, "Developing a Metal Shell Circular Plastic Connector", *Fifteenth Annual Connectors and Interconnection Technology Symposium Proceedings*, pp. 365–374 (Nov. 1982).

(List continued on next page.)

*Primary Examiner*—Leo P. Picard
*Assistant Examiner*—Tuan Dinh
(74) *Attorney, Agent, or Firm*—Jerry M. Presson; John E. Holmes; Joseph J. Buczynski

(57) ABSTRACT

A faceplate assembly, for use with an electronic circuit card, comprising a faceplate and a movable plate, each including conductive portions or being made of a conductive material, and in electrical contact with each other. The faceplate is adapted to mount to an electronic circuit card, and has first and second opposite edges. The movable plate has a free edge and is movably coupled to the faceplate to move, by pivoting, sliding or the like, with respect to the faceplate between a retracted position and an extended position. Movement of the movable plate can be effected manually, or automatically by movement of the latches on the electronic circuit card assembly which latch the electronic circuit card assembly into an electronic circuit card housing. When the electronic circuit card assembly is inserted into the electronic circuit card housing, and the movable plate is positioned in its retracted position either manually or by positioning the latches in their unlatched positions, the movable plate avoids contact with a faceplate of an adjacently inserted electronic circuit card assembly. When the movable plate is then positioned at its extended position either manually or by movement of the latches to their latched positions, an edge of the movable plate extends beyond an edge of the faceplate so that the movable plate contacts the faceplate assembly of the adjacently inserted electronic circuit card, thus establishing an electrical connection between the adjacent faceplate assemblies to provide an electroconductive shunt across the opening between the adjacent faceplate assemblies. The electroconductive shunt attenuates, and thus reduces EMI emissions through the opening, thus reducing EMI emissions from the circuit card housing.

25 Claims, 33 Drawing Sheets

U.S. PATENT DOCUMENTS

| | | | |
|---|---|---|---|
| 3,573,558 | 4/1971 | Babcock | 361/680 |
| 3,860,318 | 1/1975 | Reavis, Jr. et al. | 439/406 |
| 3,904,810 | 9/1975 | Kraus | 174/35 MS |
| 3,917,978 | 11/1975 | Menzel et al. | 361/220 |
| 4,070,557 | 1/1978 | Ostapovitch . | |
| 4,203,148 | 5/1980 | McComas | 361/752 |
| 4,301,494 | 11/1981 | Jordon | 361/798 |
| 4,384,165 | 5/1983 | Loving, Jr. et al. | 174/35 GC |
| 4,386,388 | 5/1983 | Beun | 361/752 |
| 4,525,802 | 7/1985 | Hackamack | 361/683 |
| 4,547,835 | 10/1985 | Pansaerts et al. | 361/759 |
| 4,567,317 | 1/1986 | Ehrlich et al. | 385/827 |
| 4,631,641 | 12/1986 | Brombal et al. | 361/818 |
| 4,683,550 | 7/1987 | Jindrick et al. | 708/550 |
| 4,694,380 | 9/1987 | Mallory et al. | 361/816 |
| 4,713,633 | 12/1987 | Saito et al. | 333/222 |
| 4,744,006 | 5/1988 | Duffield | 361/686 |
| 4,758,928 | 7/1988 | Wierec et al. | 361/801 |
| 4,762,966 | 8/1988 | Kosanda | 174/35 GC |
| 4,780,570 | 10/1988 | Chuck | 174/35 GC |
| 4,791,524 | 12/1988 | Teigen et al. | 361/214 |
| 4,821,145 | 4/1989 | Corfits et al. | 174/35 MS |
| 4,823,235 | 4/1989 | Suzuki et al. | 361/818 |
| 4,829,432 | 5/1989 | Hershberger et al. | 361/818 |
| 4,851,609 | 7/1989 | Reddy | 174/35 R |
| 4,864,458 | 9/1989 | Demorat, Jr. et al. | 361/212 |
| 4,872,212 | 10/1989 | Roos et al. | 361/818 |
| 4,894,753 | 1/1990 | Wadell et al. | 361/818 |
| 4,903,170 | 2/1990 | Finney et al. | 361/818 |
| 4,970,625 | 11/1990 | Belanger et al. | 361/818 |
| 4,991,062 | 2/1991 | Nguyenngoc | 361/818 |
| 5,084,802 | 1/1992 | Nguyenngoc | 361/818 |
| 5,335,147 | 8/1994 | Weber | 174/35 R |
| 5,386,346 | 1/1995 | Gleadall | 361/799 |
| 5,428,507 | * 6/1995 | Chatel et al. | 361/798 |
| 5,434,752 | * 7/1995 | Huth et al. | 361/798 |
| 5,463,532 | 10/1995 | Petitpierre | 361/800 |
| 5,491,613 | 2/1996 | Petitpierre | 361/800 |
| 5,848,906 | * 12/1998 | Glusker et al. | 439/157 |

FOREIGN PATENT DOCUMENTS

| | | |
|---|---|---|
| 3211758 | 10/1983 | (DE) . |
| 3228398 | 2/1984 | (DE) . |
| 3231886 | 3/1984 | (DE) . |
| 3626852 | 2/1988 | (DE) . |
| 0090539 | 10/1983 | (EP) . |
| 2571922 | 10/1984 | (FR) . |
| 2196798 | 5/1988 | (GB) . |
| 2208970 | 4/1989 | (GB) . |
| 2263199 | 7/1993 | (GB) . |
| 1-95598 | 4/1989 | (JP) . |
| 2100398 | 4/1990 | (JP) . |
| 3116997 | 5/1991 | (JP) . |
| 3224298 | 10/1991 | (JP) . |
| 3270097 | 12/1991 | (JP) . |
| 4-15996 | 1/1992 | (JP) . |
| 4-94191 | 3/1992 | (JP) . |
| 5-55767 | 3/1993 | (JP) . |
| 5-55781 | 3/1993 | (JP) . |

OTHER PUBLICATIONS

*Guide to Interference Control Using Beryllium Cooper*, Instrument Specialties Co., Inc., Catalog $E^3$–78 (1987).

"EMI/ESD Depletion Strip", *IBM Technical Disclosure Bulletin* vol. 32, No. 3B, pp. 126–127 (Aug. 1989).

Sears and Zemansky, *University Physics*, Fourth Edition, pp. 392–393.

N.Y. Telephone Scheme.

* cited by examiner

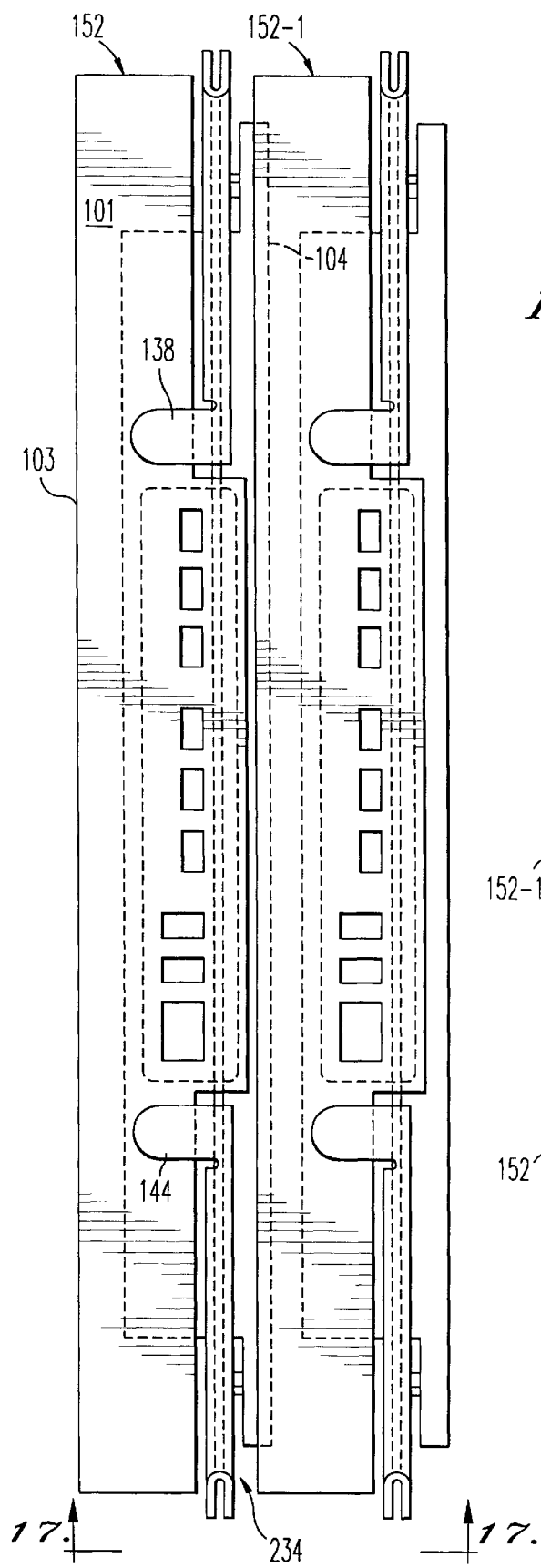
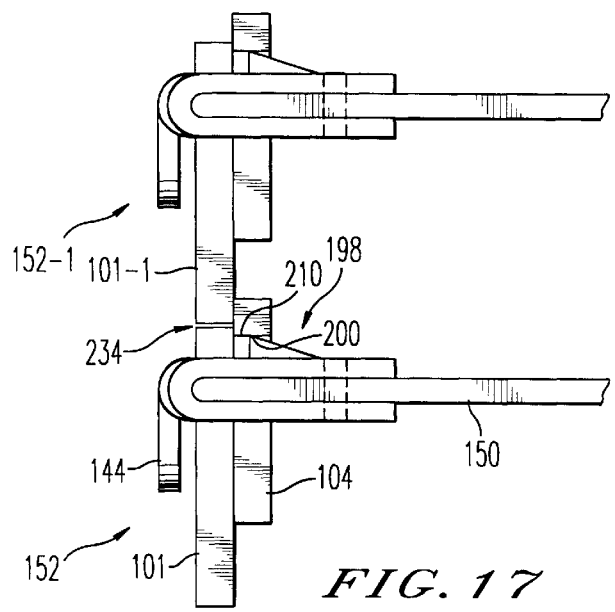
FIG. 16
FIG. 17

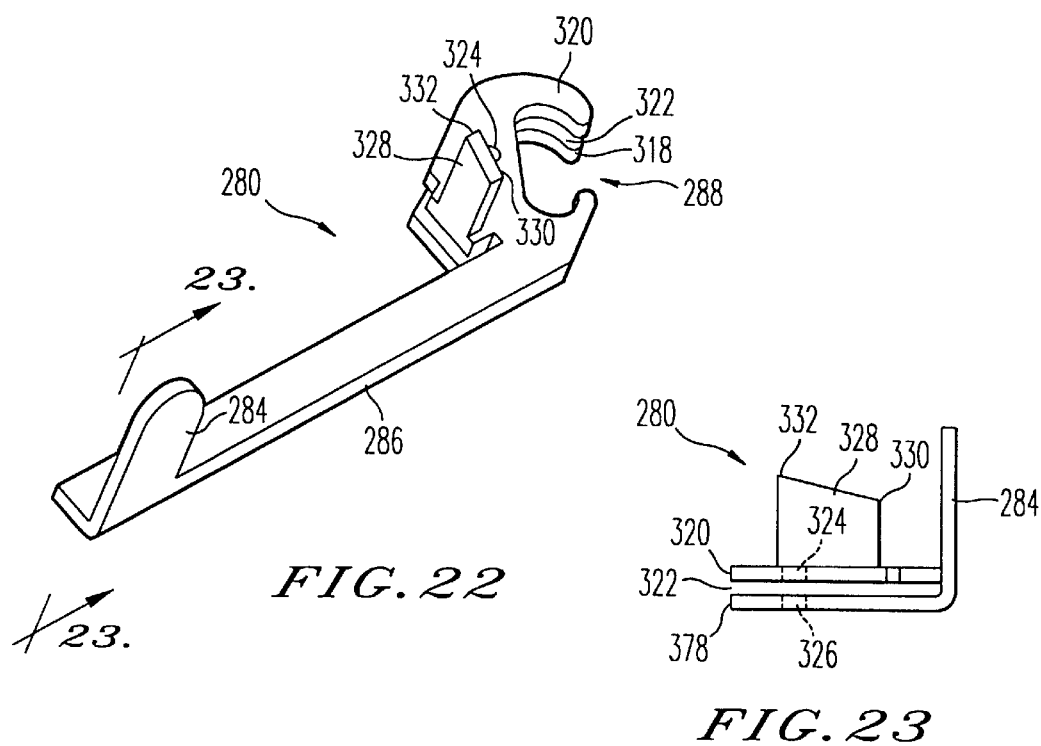
FIG.22
FIG.23
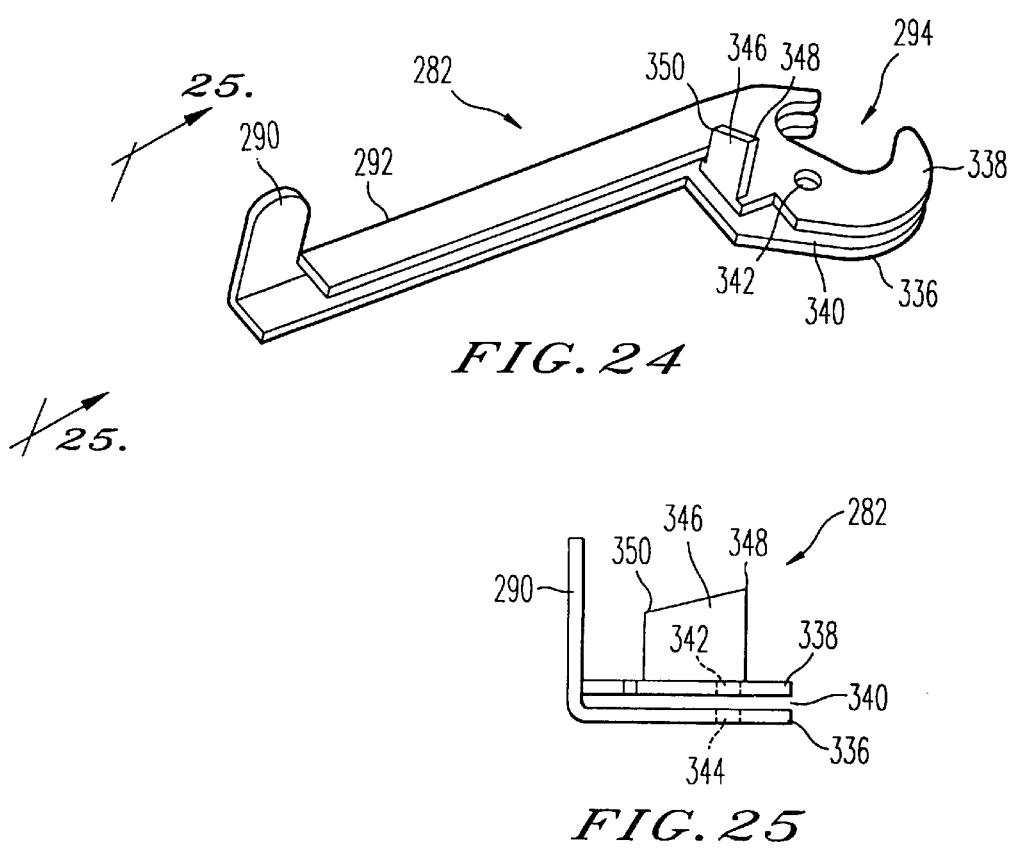
FIG.24
FIG.25

FACEPLATE FOR AN ELECTRONIC CIRCUIT CARD FOR REDUCING EMI EMISSIONS BETWEEN CIRCUIT CARDS INSERTED IN A CIRCUIT CARD HOUSING

BACKGROUND OF THE INVENTION

1. Field of the Invention

The present relates to a faceplate for an electronic circuit card which reduces EMI emissions between a plurality of such circuit cards inserted in a circuit card housing. More specifically, the present invention relates to an electronic circuit card faceplate having an electrically conductive movable member which can be moved into contact with the faceplate of an adjacent circuit card inserted in the circuit card housing to reduce EMI emissions through the space between the faceplates of the adjacently inserted circuit cards.

2. Description of the Related Art

Many types of analog and digital electrical equipment produce stray electromagnetic radiation, referred to as electromagnetic interference (EMI), which is emitted into the surrounding environment. The EMI usually results from analog circuit components which oscillate at high frequencies, or from digital components which operate at high clocking or switching rates. These emissions are undesirable since they can, if sufficiently strong, interfere with the operation of radio receivers and other nearby electrical equipment. Regulations have been established for the maximum permissible EMI emissions from various types of electrical equipment, and these regulations must be taken into account when designing new equipment in which EMI might be a problem.

For some types of electronic equipment, such as telephone channel banks used to carry out analog-to-digital and digital-to-analog conversion between subscriber lines and telephone company lines, EMI reduction is difficult because of the basic design of the equipment and the practical need to allow access to the equipment by service personnel. Typically, telephone channel banks consist of rows of pull-out circuit cards, referred to as channel units, which are contained in a metal frame or housing. The housing is grounded and provides effective EMI shielding at the top, bottom, sides and back of the channel banks, but there is little shielding at the front since the frame must be left open to allow for the removal and replacement of the individual channel units. In essence, the rectangular front opening of each row or shelf in the housing serves as a slot or waveguide antenna for the electromagnetic radiation. Even though these openings are physically closed off by the channel unit faceplates when all of the channel units are fully inserted, they are electrically open since the channel unit faceplates are typically made of plastic and are essentially transparent to electromagnetic radiation.

Several approaches have been developed for reducing EMI emissions and telephone channel banks. For example, as described in U.S. Pat. Nos. 4,991,062 and 5,084,802, both to Nguyenngoc, and both incorporated by reference herein in their entirety, a resilient metal strip is fastened to the back of the channel unit (circuit card) faceplate and configured to contact the outwardly facing conductive areas of the grounded channel bank housing when the channel unit is inserted into the grounded channel bank housing. The resilient metal strip thus creates an electroconductive shunt across the shelf opening and reduces its effectiveness as a slot antenna. Other arrangements for reducing EMI emissions in telephone channel banks are described in U.S. Pat. No. 5,386,346 to Wilfred L. Gleadall, U.S. Pat. No. 5,491,613 to Eric M. Petitpierre, and U.S. Pat. No. 5,463,532 to Eric M. Petitpierre and John E. Holmes, each of which is incorporated by reference herein in its entirety.

Although these approaches are effective in significantly reducing EMI emissions in telephone channel banks, they do not provide a continuous conductive shell or Faraday shield across the shelf opening which eliminates all or essentially all EMI emissions. In particular, in all of the arrangements discussed above, an electrically open space, if not a physical space, transparent to electromagnetic radiation exists between the adjacent channel unit faceplates, through which some EMI can be emitted into the surrounding environment.

A number of approaches have been developed for reducing EMI emissions through the spaces between faceplates of circuit cards inserted into circuit card housings. For example, as described in U.S. Pat. No. 4,970,625 to Belanger et al., U.S. Pat. No. 4,903,170 to Finney et al., U.S. Pat. No. 4,872,212 to Roos et al., and U.S. Pat. No. 4,631,641 to Brombal et al., all of which are incorporated by reference herein in their entirety, as well as in published U.K. Patent Application Nos. 2263199 and 2196798, and in published Japanese Patent Application No. 4-15996, a plurality of resilient electrically conductive strips, made of a beryllium copper alloy or similar material, are connected along one of the side edges of the circuit card faceplate. Hence, when the circuit cards are inserted into a circuit card housing, the resilient electrically conductive strips on one faceplate contact the faceplate of an adjacent circuit card, thus creating an electrical interconnection between the faceplates. The electrical interconnection acts as an electroconductive shunt across the opening between the faceplates to reduce EMI emissions between the faceplates. However, several disadvantages exist with these types of electrically conductive strip configurations.

In particular, the resilient electrically conductive strips are generally sharp, and therefore can easily cut the fingers of a person installing or handling the circuit card. Also, the electrically conductive strips make installation of the circuit card more difficult, because they rub against, and can even be obstructed by, the faceplate of an adjacent circuit card during installation. An increased insertion force must therefore be applied to the circuit card to load the circuit card into the housing. This makes the resilient electrically conductive strips very susceptible to damage, especially during insertion and removal of the circuit cards. Broken metal strips can enter the interior of the circuit card housing, and create unwanted short circuits between components, which could cause damage to those or other components.

As an alternative to using resilient electrically conductive metal strips, a compressible foam coated with a fine metal mesh can be attached to one edge of each circuit card faceplates. When a circuit card is inserted into the housing, the metal mesh makes electrical contact with the faceplate of the adjacently inserted circuit card, thus creating an electroconductive shunt across the opening between the adjacent circuit card faceplates. Because the metal mesh has few, if any, sharp edges, it is much less likely to cause injury to a person handling the circuit card.

However, like the electrically conductive metal strips, the compressible foam rubs against, and can be obstructed by, the adjacent circuit card faceplate, which increases the force necessary to load the circuit card into the housing. This contact with adjacent circuit card faceplates during insertion and uninsertion also makes the compressible foam and metal mesh very susceptible to damage. Furthermore, the metal mesh typically does not conduct as well as the resilient electrically conductive strips. Therefore, the metal mesh provides a less effective EMI shield than the electrically conductive strips, while offering little advantage over the conductive strips.

Instead of attempting to provide electroconductive shunts between the individual faceplates as described above, a conductive door can be mounted to the housing. When the conductive door is in the closed position in front of the circuit card faceplates, it functions as a continuous conductive shell or Faraday shield. Although this approach would be effective in blocking essentially all EMI emissions through the spaces between the circuit card faceplates, a door of this type generally may not be desirable for cost or aesthetic reasons. Furthermore, the door in its closed position would prevent access to the fronts of the faceplates, which may be required for maintenance purposes. Due to the potential inconvenience that the door would create, it is likely that operators and technicians would fail to keep the door in a closed position to allow access to the faceplates. Also, the standard circuit card housings would require modification to accommodate this type of door. Hence, although a door of this type could be effective when used as intended, the above drawbacks make it an impractical solution.

A continuing need therefore exists for an apparatus which reduces EMI emissions through the openings between the faceplates of electronic circuit cards inserted in a circuit card housing.

SUMMARY OF INVENTION

An object of the present invention is to provide a safe, reliable and easy to use apparatus for reducing EMI emissions through the openings between faceplates of adjacent electronic circuit cards inserted into a circuit card housing.

Another object of the invention is to provide an apparatus which is adapted for use with a conventional circuit card faceplate, and is movable between an extended position for reducing EMI emissions through openings between the faceplates of adjacent electronic circuit cards inserted in a housing, and a retracted position which enables the electronic circuit cards to be removed essentially without restriction from the circuit card housing.

A further object of the invention is to provide an apparatus for reducing EMI emissions through the spaces between faceplates of adjacent inserted electronic circuit cards in a circuit card housing, which is automatically positioned in an EMI emission reduction position by the movement of at least one latch on the circuit cards into a latched position which latches the circuit cards into the circuit card housing, and is further automatically positioned in a retracted position by the movement of the latch to an unlatched position.

These and other objects of the invention are substantially achieved by providing a faceplate assembly, for use with an electronic circuit card, comprising a faceplate and a movable plate. The faceplate is adapted to mount to an electronic circuit card, and has first and second opposite edges. The movable plate has a free edge and is movably coupled to the faceplate to move with respect to the faceplate between a retracted position, at which the free edge is substantially aligned with or at a first distance from the first edge of the faceplate, and an extended position at which the free edge extends past the first edge of the faceplate. The faceplate and movable plate each include conductive portions which are in electrical contact with each other. When the electronic circuit card is inserted into an electronic circuit card housing, and the movable plate is positioned at the extended position, the movable plate is adapted to contact a faceplate assembly of an adjacently inserted electronic circuit card, thereby establishing an electrical connection between the faceplate assembly and the adjacently inserted faceplate assembly to provide an electroconductive shunt across the opening between the adjacent faceplate assemblies. The electroconductive shunt reduces the effectiveness of the opening as a slot antenna, and thus reduces EMI emissions through the opening.

The movable plate can be mechanically coupled to at least one latch of the electronic circuit card which is used to latch the electronic circuit card in the circuit card housing. In this event, when the latch is in the latched position, the latch automatically positions the movable plate at the extended position to contact the faceplate assembly of an adjacently inserted circuit card. When the latch is moved to an unlatched position, the latch automatically retracts the movable plate to the retracted position at which the movable plate avoids contact with the faceplate assembly of the adjacently inserted card. Therefore, the electronic circuit card can be removed from the circuit card housing essentially without restriction.

Alternatively, the movable plate can be moved independently of the latch of the electronic circuit card. The movable plate can extend the entire or substantially the entire length of the faceplate, or any fraction thereof. Also, the faceplate assembly can include a plurality of movable plates which are each a fraction of the length of the faceplate and are disposed at intervals along the faceplate. Additionally, the faceplate can include a slot to receive the movable plate or plates of an adjacent faceplate assembly to create an interlocking tongue-and-groove configuration between the adjacent faceplate assemblies.

BRIEF DESCRIPTION OF THE DRAWING

The various objects, advantages and novel features of the present invention will be more readily appreciated from the following detailed description when read in conjunction with the accompanying drawings, in which:

FIG. 16 is a schematic view illustrating engagement of the movable plate of the faceplate assembly of the electronic circuit card assembly shown in FIG. 3 and 4, with a faceplate assembly of an electronic circuit card assembly which has been adjacently inserted into the circuit card housing shown in FIG. 9;

FIG. 17 is an end view of the adjacently inserted electronic circuit card assemblies as taken along lines 17—17 in FIG. 16;

FIG. 22 is a detailed perspective view of the top latch of the faceplate assembly of the electronic circuit card assembly shown in FIG. 21;

FIG. 23 is a front view of the top latch taken along lines 23—23 in FIG. 22;

FIG. 24 is a detailed perspective view of the bottom latch of the faceplate assembly of the electronic circuit card assembly shown in FIG. 21;

FIG. 25 is a front view of the bottom latch taken along lines 25—25 in FIG. 24;

DETAILED DESCRIPTION OF THE PREFERRED EMBODIMENTS

Figure 1:
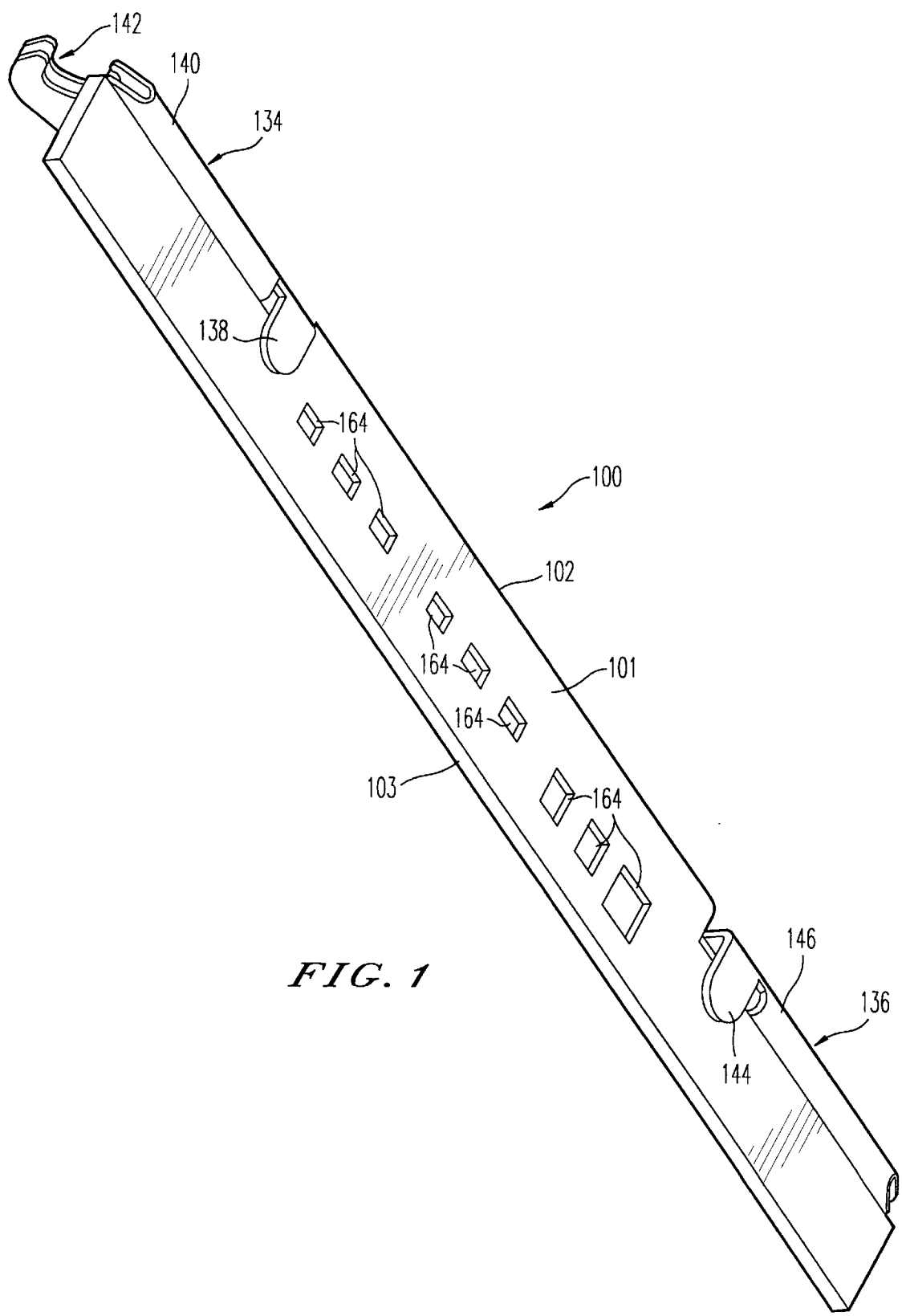
FIG. 1 is a front perspective view of a faceplate assembly according to an embodiment of the present invention.
Figure 2:
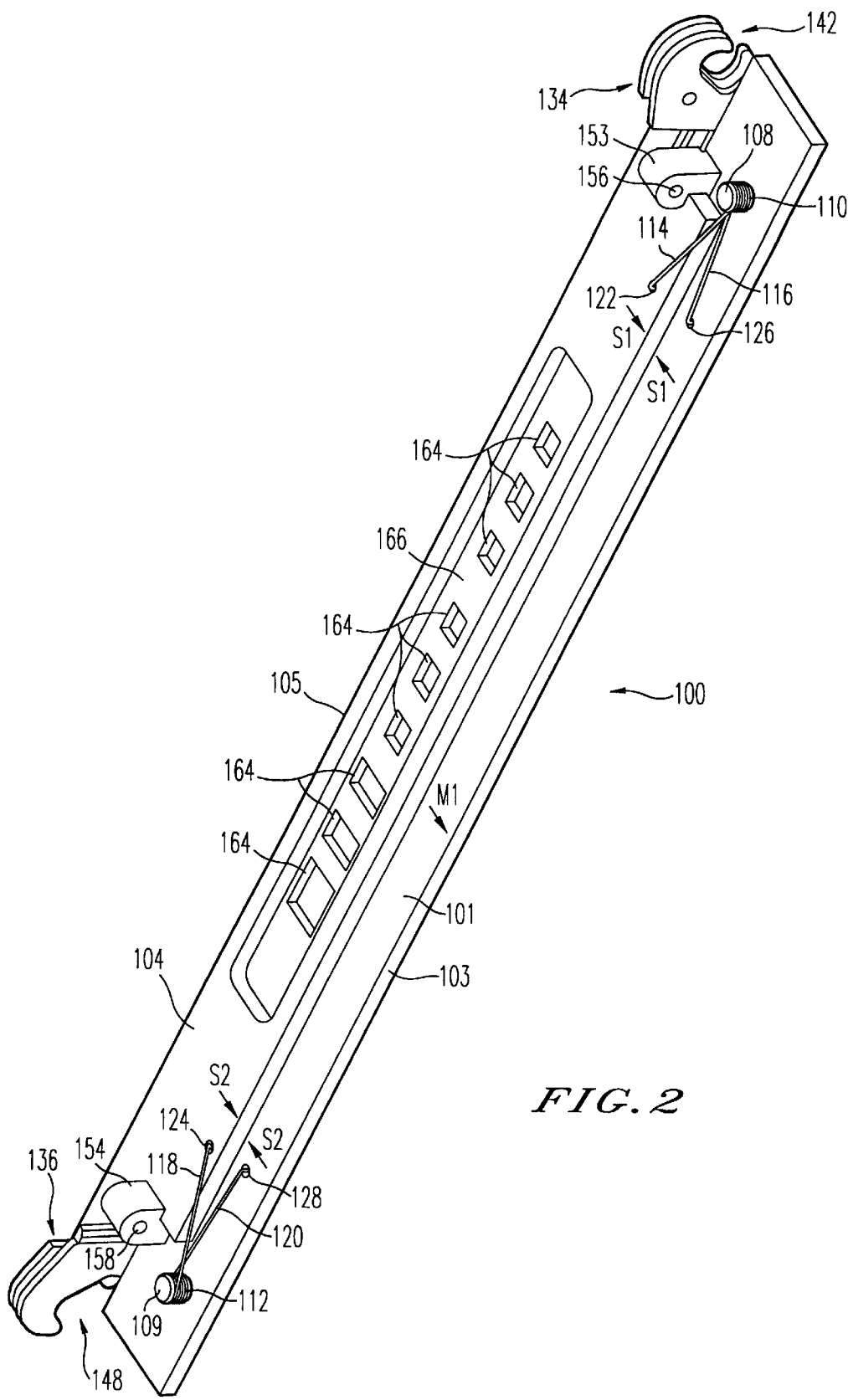
FIG. 2 is a rear perspective view of the faceplate assembly shown in FIG. 1.

A faceplate assembly 100 according to an embodiment of the present invention, adapted for use with an electronic circuit card, is shown in FIGS. 1–4. The faceplate assembly 100 includes a faceplate 101 having a first edge 102 and a second edge 103, and a movable plate 104 having a free edge 105 and a secured edge 106. The length of movable plate 104 can be any fraction of the length of faceplate 101 which would enable movable plate 104 to achieve its intended purpose as described below.

The faceplate 101 and movable plate 104 each include, for example, a nonconductive base made of, for example, plastic or composite base having electrically conductive portions or strips attached thereto, or could each be made entirely or essentially entirely from an electrically conductive material such as metal, conductive plastic, or the like. Also, faceplate 101 can include, for example, metal strip arrangements such as those described in U.S. Pat. No. 5,386,346 to Wilfred L. Gleadall, U.S. Pat. No. 5,491,613 to Eric M. Petitpierre, and U.S. Pat. No. 5,463,532 to Eric M. Petitpierre and John E. Holmes, cited above. In any event, the electrically conductive portions of faceplate 101 and movable plate 104 remain in electrical contact with each other regardless of the position of the movable plate 104 as described in more detail below.

Figure 3:
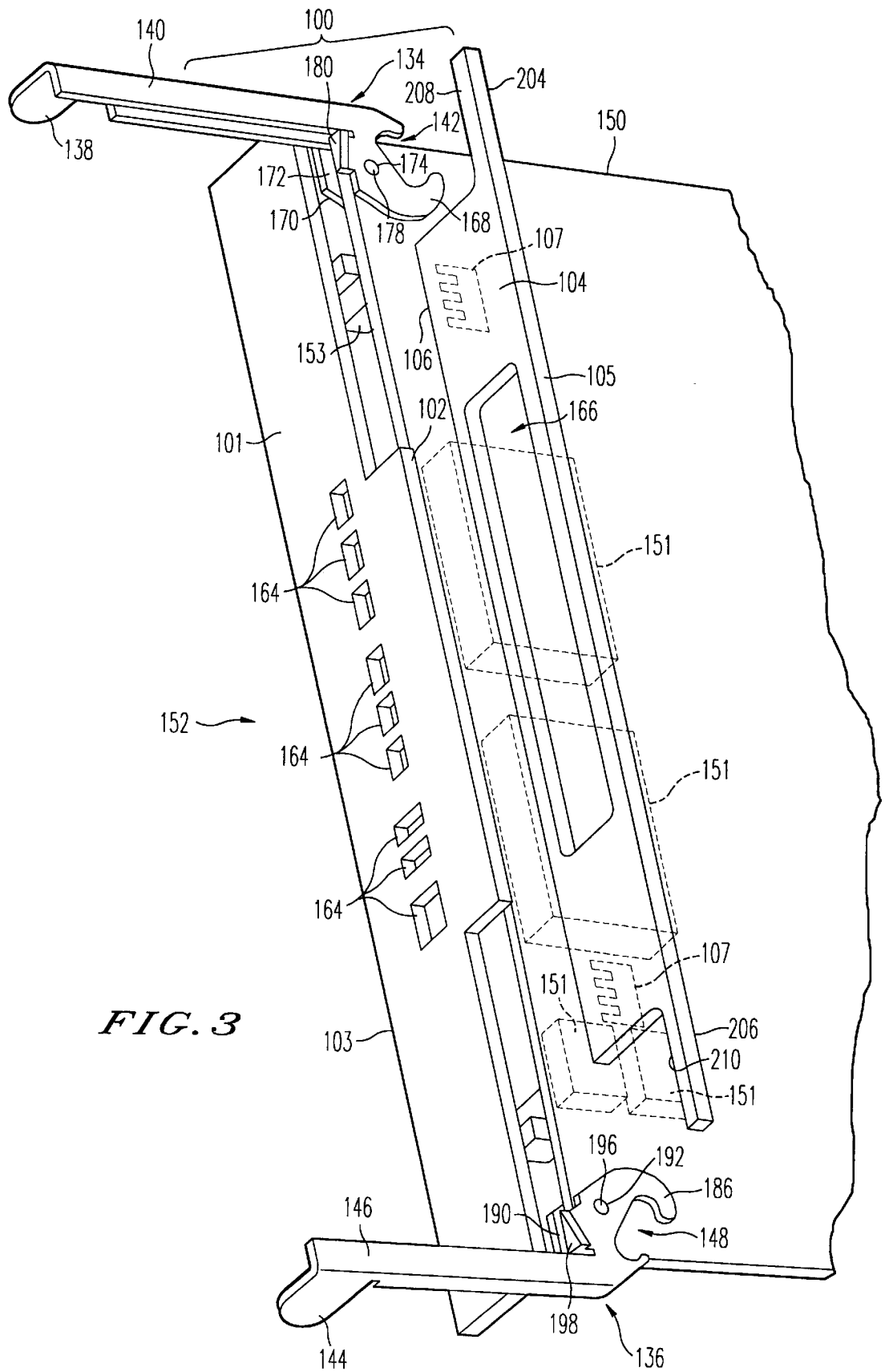
FIG. 3 is an exploded front perspective view of the faceplate assembly show in FIG. 1 attached to an electronic circuit card to form an electronic circuit card assembly.

To aid in establishing and maintaining electrical contact between the electrically conductive portions of faceplate 101 and movable plate 104, resilient electrically conductive strips 107, such as those described above which are made of a beryllium copper alloy or similar material, could be mounted to the faceplate 101, movable plate 104, or both, as shown in phantom in FIG. 3. To minimize the likelihood of injury to a person handling the faceplate assembly 100, the conductive strips 107 are positioned such that they are sandwiched between the faceplate 101 and movable plate 104, and are thus essentially hidden from access by a user.

The faceplate assembly 100 includes posts 108 and 109 made, for example, of metal or any other suitable materials, and which are, for example, pressed into respective openings (not shown) on the back side of faceplate 101, or integral with faceplate 101. The faceplate assembly 100 further includes springs 110 and 112, which are mounted to posts 107 and 108, respectively. Spring 110 includes legs 114 and 116, and spring 112 includes legs 118 and 120. As shown in detail, for example, in FIG. 2, the distal end of leg 114 is received into an opening 122 in movable plate 104, and the distal end of leg 118 of spring 108 is received into an opening 124 in movable plate 104. Similarly, the distal end of leg 116 of spring 110 is received into an opening 126 in faceplate 101, and the distal end of leg 120 of spring 112 is received into an opening 128 in faceplate 101.

In this embodiment, spring 110 is configured so that its legs 114 and 116 are urged toward each other. Likewise, spring 112 is configured so that its legs 118 and 120 are urged toward each other. Springs 110 and 112 therefore slidably couple movable plate 104 to faceplate 101, and urge movable plate 104 and faceplate 101 toward each other in the directions indicated by arrows S1 and S2 in FIG. 2. If faceplate 101 is maintained stationary, springs 110 and 112 urge movable plate 104 in the direction indicated by arrow M1 in FIGS. 2 and 4. That is, springs 110 and 112 urge the free edge 105 of movable plate 104 toward the edge 102 of faceplate 101, and likewise urge the secured edge 106 of movable plate 104 toward the edge 103 of faceplate 101. Movement of movable plate 104 by the force of springs 110 and 112 is limited as discussed in more detail below.

Faceplate assembly 100 further includes a top latch 134 and a bottom latch 136, the purposes of which are described in more detail below. Top latch 134 includes a tab 138, a shaft 140 and a pawl arrangement 142. Similarly, bottom latch 136 includes a tab 144, a shaft 146 and a pawl arrangement 148.

Figure 4:
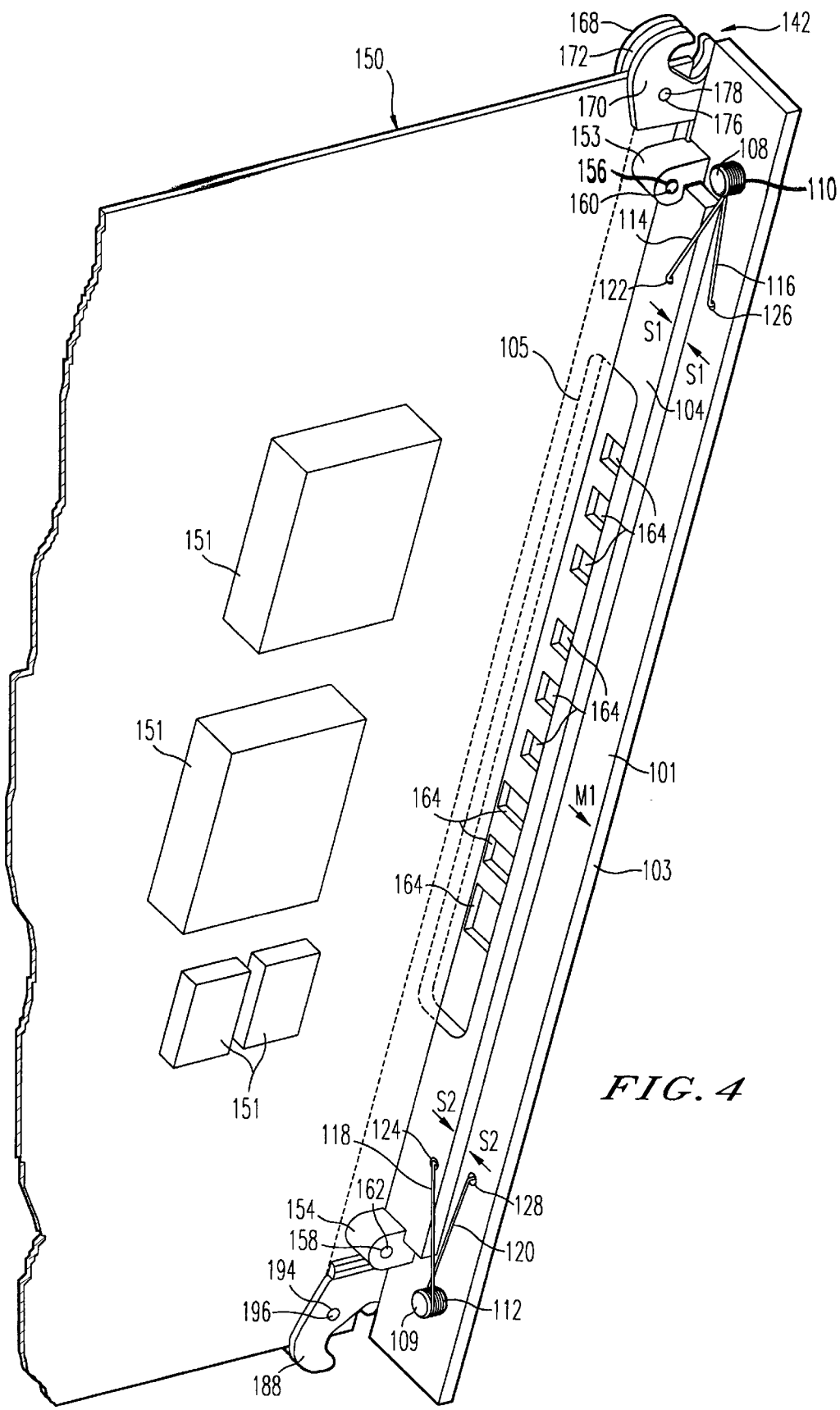
FIG. 4 is a rear perspective view of the electronic circuit card assembly shown in FIG. 3.

As shown in FIGS. 3 and 4, the faceplate assembly 100 is adapted to be connected to an electronic circuit card 150 having components 151 mounted thereon, such as those used in telephone channel banks as described above in the background section, to form an electronic circuit card assembly 152. The faceplate 101 includes mounting blocks 153 and 154 which can be made of metal or any other suitable material, and are mounted to the faceplate 101 by press-fitting, rivets, screws, pins, or any other suitable fastening device. The mounting blocks 153 and 154 also can be integral with the faceplate 101.

Mounting blocks 153 and 154 include openings 156 and 158 therein, respectively. As shown in FIG. 4, in particular, openings 156 and 158 receive pins 160 and 162, respectively, which are fastened to the electronic circuit card 150 in any suitable manner, and therefore connect the electronic circuit card 150 to the faceplate 101. The pins 160 and 162 themselves can be any suitable fastening member, such as screws, rivets, posts, or the like. The faceplate 101 includes openings 164 having various sizes and shapes for accommodating components on the electronic circuit card 150, such as LEDs, plugs, switches, and the like. Likewise, movable plate 104 includes an opening 166 therein which allows those components on the electronic circuit card 150 to be viewed or accessible through openings 164 in the faceplate 101.

Figure 5:
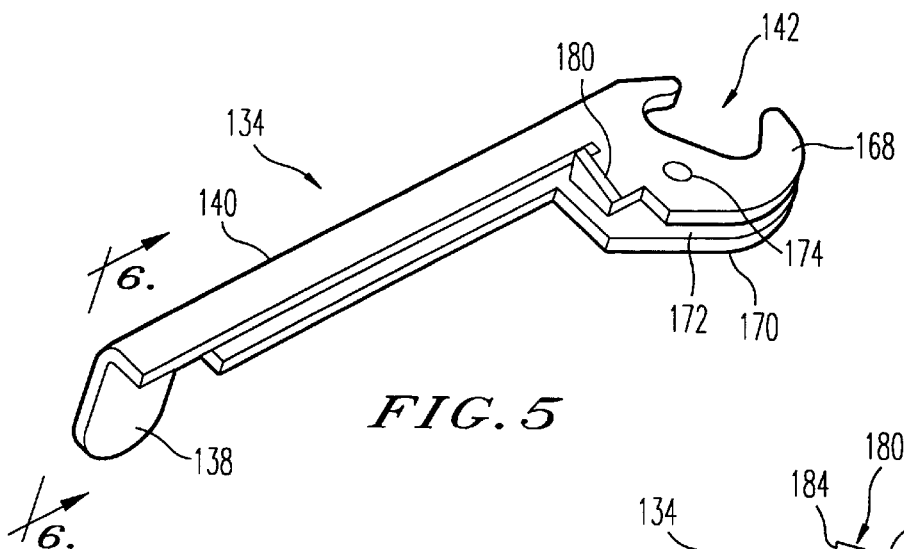
FIG. 5 is a detailed perspective view of the top latch of the faceplate assembly shown in FIGS. 1–4.
Figure 6:
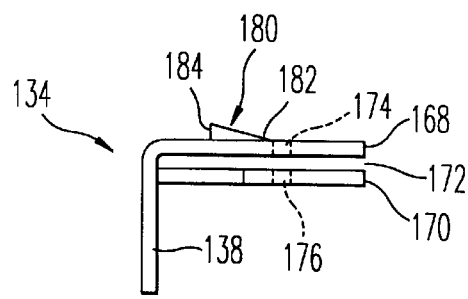
FIG. 6 is a side view of the top latch taken along lines 6—6 in FIG. 5.

The top and bottom latches 134 and 136 are also connected to the electronic circuit card 150. That is, as shown in FIGS. 5 and 6, the pawl arrangement 142 of top latch 134 includes an outer pawl 168 and an inner pawl 170 which are separated by a space 172. The outer pawl 168 includes an opening 174 therein which is aligned with or substantially aligned with a similar opening 176 (see FIGS. 4 and 6) in inner pawl 170. As further shown in FIG. 3, and in more detail in FIGS. 5 and 6, outer pawl 168 of top latch 134 includes a ramped portion 180 having a low end 182 and a high end 184, the significance of which is described in detail below. Although the ramped portion 180 is shown as being substantially linear from its low to high ends 182 and 184, the ramped portion 180 could be curved, spiral, helical, or any other suitable shape which will acheive the purpose described below.

To mount the top latch 134 to the electronic circuit card 150, an edge of the electronic circuit card 150 is received into opening 172 as shown, for example in FIGS. 3 and 4. A pin 178, such as a rivet, pin, screw, or any other suitable pin-like fastener, is passed through opening 174, through an opening (not shown) in electronic circuit card 150, and through opening 176, and is secured into openings 174 and 176 by any suitable method, such as press-fitting, screwing, an adhesive, crimping, or the like. The pin 178 therefore pivotally couples the top latch 134 to the electronic circuit card 150 between a latched position and an unlatched position, the details and significance of which are described below.

Figure 7:
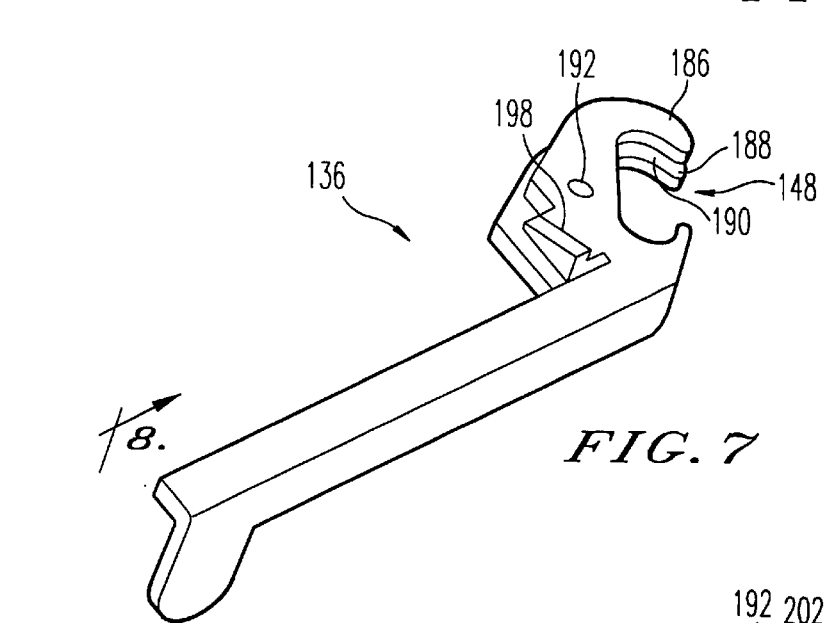
FIG. 7 is a detailed perspective view of the bottom latch of the faceplate assembly show in FIGS. 1–4.
Figure 8:
FIG. 8 is a front view of the bottom latch taken along lines 8—8 in FIG. 7.

As shown in detail in FIGS. 7 and 8, the pawl arrangement in 148 of bottom latch 136 includes an outer pawl 186 and an inner pawl 188 that are separated by a space 190. The outer pawl 186 has an opening 192 therein which is aligned or substantially aligned with a similar opening 194 (see FIGS. 4 and 8) in inner pawl 188. As further shown in detail in FIGS. 7 and 8, outer pawl 186 includes a ramped portion 198 having a high end 200 and low end 202, the significance of which is described in more detail below. Although the ramped portion 198 is shown as being substantially linear from its low to high ends 202 and 200, the ramped portion 198 could be curved, spiral, helical, or any other suitable shape which will acheive the purpose described below.

As shown in FIGS. 3 and 4, when the bottom latch 136 is mounted to the electronic circuit card 150, an edge of electronic circuit card 150 is received into space 190. A pin 196, similar in configuration to pin 178 described above, is received into openings 192 and 194 in outer pawl 186 and inner pawl 188, respectively, and through an opening (not shown) in electronic circuit card 150. The pin 196 is secured in openings 192 and 194 in a manner similar to that in which pin 178 is secured in openings 174 and 176 as described above. Therefore, pin 196 pivotally couples bottom latch 136 to electronic circuit card 150.

As shown in FIG. 3, in particular, movable plate 104 includes tab ends 204 and 206. Tab end 204 has a surface 208 which is contacted by different areas of the ramped portion 180 as the top latch 134 is pivoted about pin 178, as described in more detail below. Similarly, tab end 206 has a surface 210 which is contacted by different areas of ramped portion 198 as the bottom latch 136 is pivoted about pin 196 as described in more detail below.

Electronic circuit card assembly 152 can be inserted into a circuit card housing as will now be described with reference to FIGS. 9–17.

Figure 9:
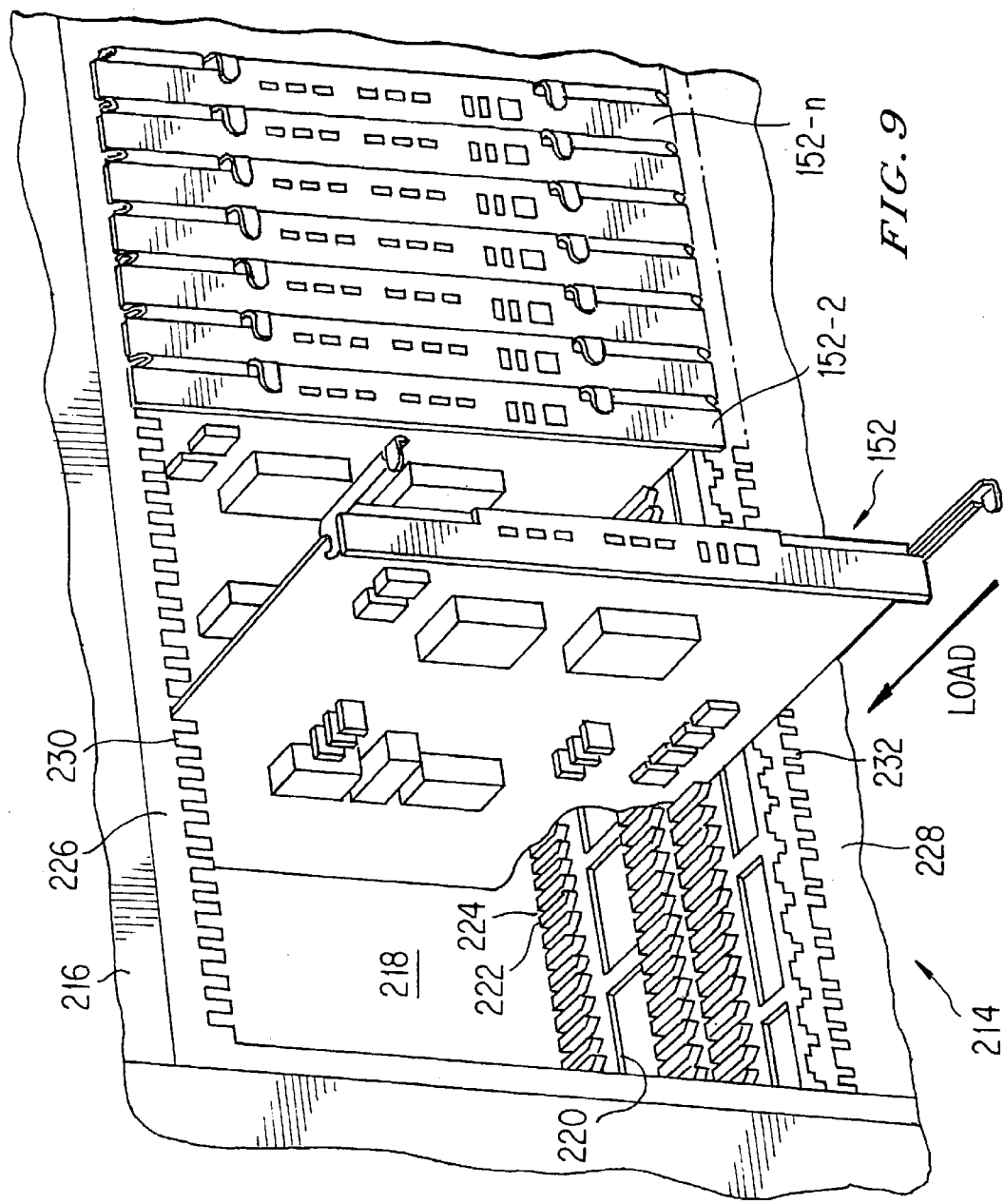
FIG. 9 is a perspective view illustrating the electronic circuit card assembly shown in FIGS. 3 and 4 being inserted into a circuit card housing.

As shown in FIG. 9, a circuit housing 214, such as a telephone channel bank described above in the background section, includes a grounded metal frame or housing 216, which is typically made of aluminum or any other suitable metal. The frame 216 defines at least one opening 218 therein into which can be inserted a plurality of electronic circuit card assemblies 152.

A perforated metal shelf 220 is mounted at the bottom of opening 218, while a similar shelf (not shown) is mounted at the type of opening 218 and extends parallel or substantially parallel to shelf 220. The top (not shown) and bottom shelves 220 each include raised guides 222 which form slots or grooves 224 for receiving an electronic circuit card assembly 152. Designator strips 226 and 228, which are typically made of metal or any other suitable conductive material, are affixed by screws (not shown) or the like to the forward surface of frame 216 immediately above and below opening 218. Designator strip 226 includes a plurality of slotted openings 230, and designated strip 228 includes a plurality of slotted openings 232 which are aligned with or substantially aligned with slotted openings 230. The slotted openings 230 and 232 are positioned as appropriate with respect to grooves 224 formed by guides 222 in the shelves 220 so that a single electronic circuit card assembly 152 can be received into one pair of slotted openings 230 and 232, and into the grooves 224 aligned with that specific pair of slotted openings 230 and 232.

Figure 10:
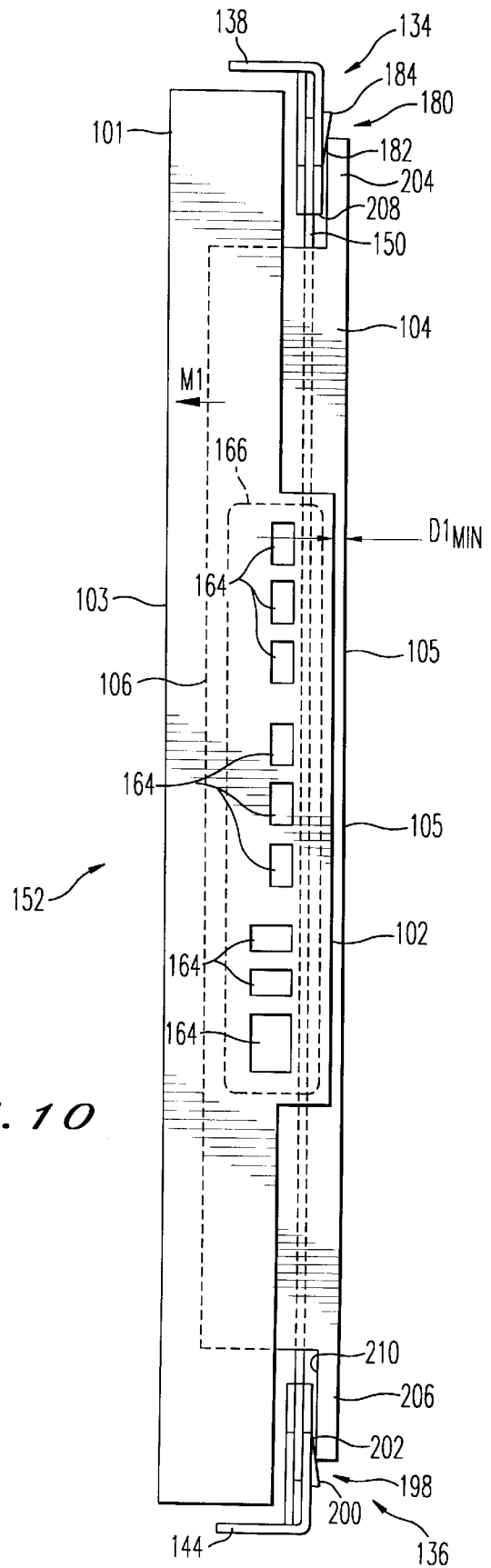
FIG. 10 is a front view of the electronic circuit card assembly shown in FIGS. 3 and 4 with the top and bottom latches of its faceplate assembly being in their unlatched positions.
Figure 11:
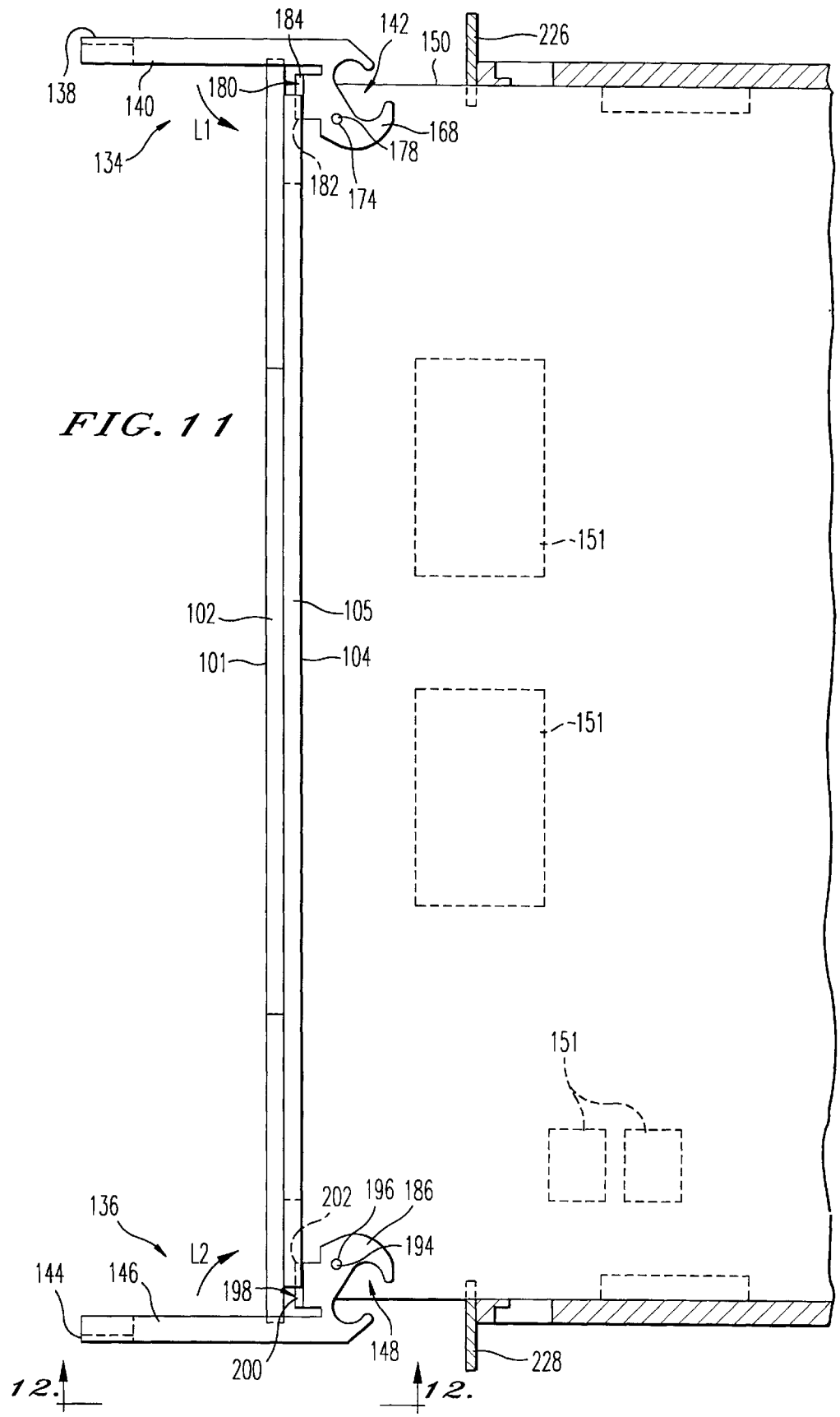
FIG. 11 is a plan view of the electronic circuit card assembly shown in FIGS. 3 and 4, taken from the side of the electronic circuit card opposite that to which components are mounted, with the latches of the faceplate assembly being positioned as shown in FIG. 10, and with the electronic circuit card assembly being positioned for engagement with the top and bottom designator strips of the circuit card housing shown in FIG. 9.
Figure 12:
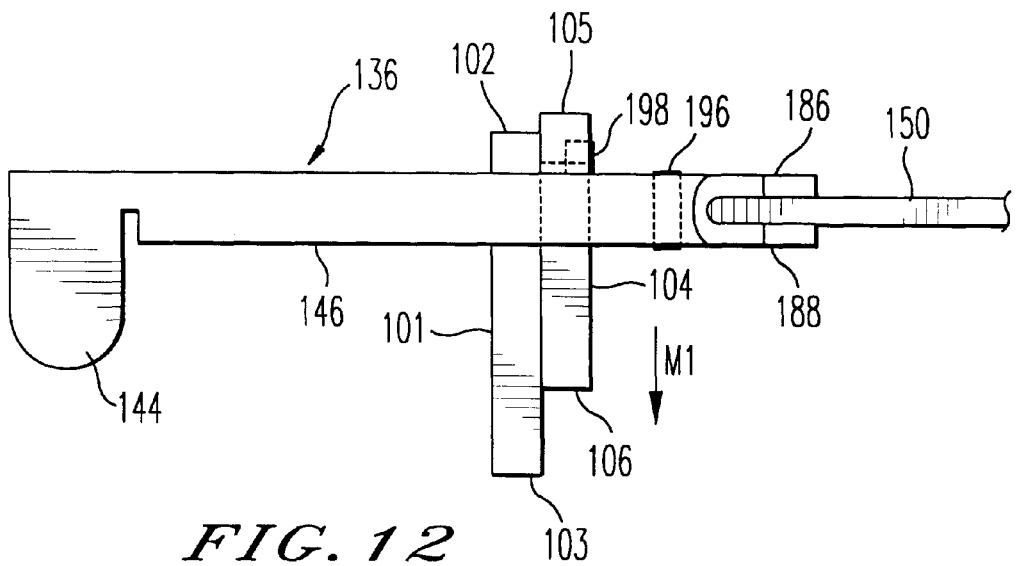
FIG. 12 is an end view of the electronic circuit card assembly as taken along lines 12—12 in FIG. 11.

When the electronic circuit card assembly 152 is made ready for insertion into circuit card housing 214, the top and bottom latches 134 and 136 are preferably positioned as shown in FIGS. 10–12 so that their shafts 140 and 146 each extend outwardly from faceplate 101 at an angle of 90° or substantially 90° from the front surface of faceplate 101. In this position, the pawl arrangements 142 and 148 are oriented about pins 178 and 196, respectively, as shown so that the low ends 182 and 202 contact surfaces 208 and 210, respectively, of tabs ends 204 and 206 of movable plate 104. This allows springs 110 and 112 to slide movable plate 104 along direction M1 (see FIGS. 2, 10 and 12) so that the free edge 105 of movable plate 104 is at a minimum distance $D1_{min}$ (FIG. 10) from the edge 102 of faceplate 101.

The minimum distance $D1_{min}$ is sufficient to allow the free edge 105 of movable plate 104 to avoid contact with the faceplate of an electronic circuit card assembly that has been inserted in the circuit card housing 214 in a position adjacent to that in which electronic circuit card assembly 152 is being inserted. For instance, the adjacent pairs of slotted openings 230 and 232 could be spaced to allow a clearance of 0.060 inches between the adjacent edges of faceplates of adjacently inserted electronic circuit card assemblies. Hence, in this case, the minimum distance $D1_{min}$ would be less than 0.060 inches.

The electronic circuit card assembly 152 is slid into the opening 218 in the circuit card housing 214 in the direction LOAD as shown in FIG. 9, until the back of faceplate 101 contacts designator strips 226 and 228. In this example, slotted openings 230 and 232 each have a width sufficient to receive pawl arrangements 142 and 148, respectively, therein. The faceplate 101 of the electronic circuit card assembly 152 therefore creates an electroconductive shunt across opening 218. The electronic circuit card assembly 152 is then ready to be latched into the circuit card housing 214.

Figure 15:
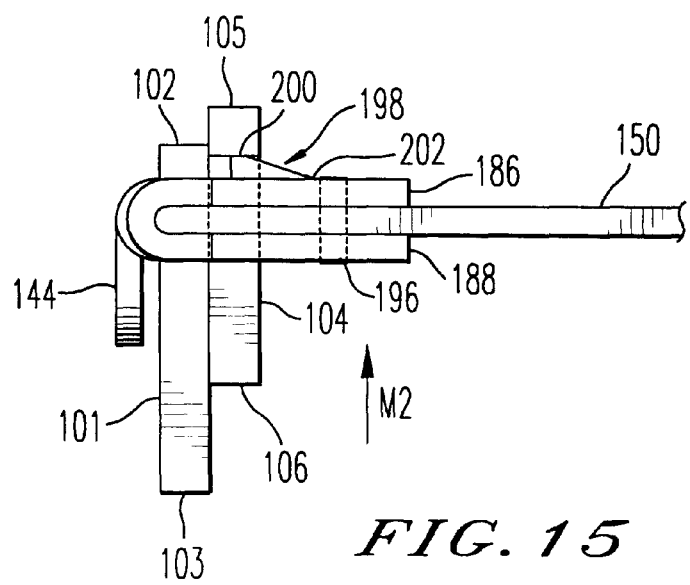
FIG. 15 is an end view of the electronic circuit card assembly taken along lines 15—15 in FIG. 14.
Figure 13:
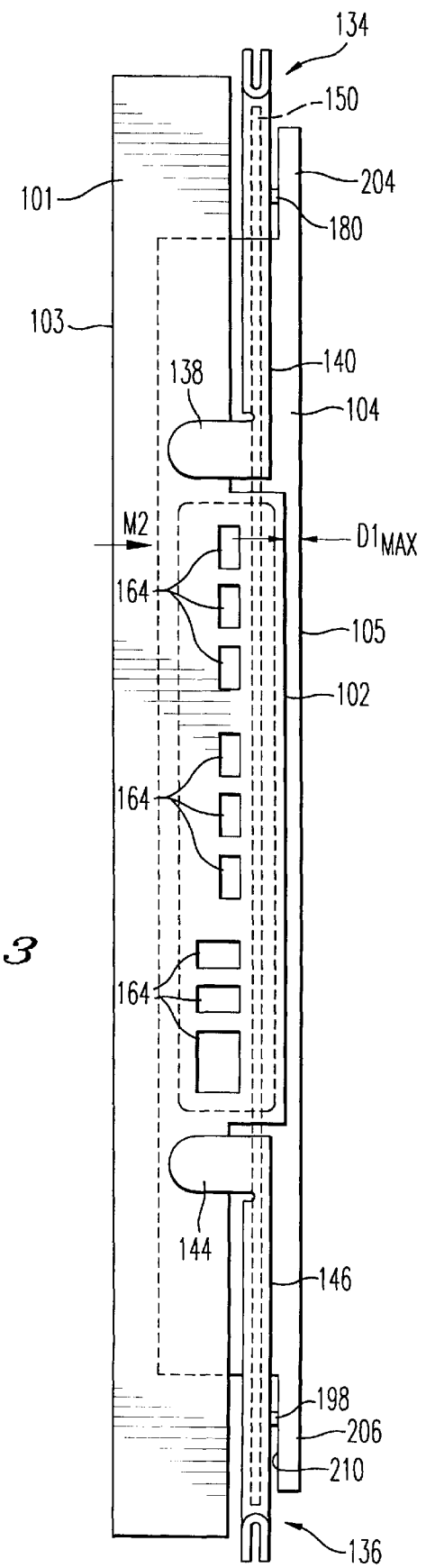
FIG. 13 is a front view of the electronic circuit card assembly as shown in FIGS. 3 and 4 with the top and bottom latches being in their latched positions.
Figure 14:
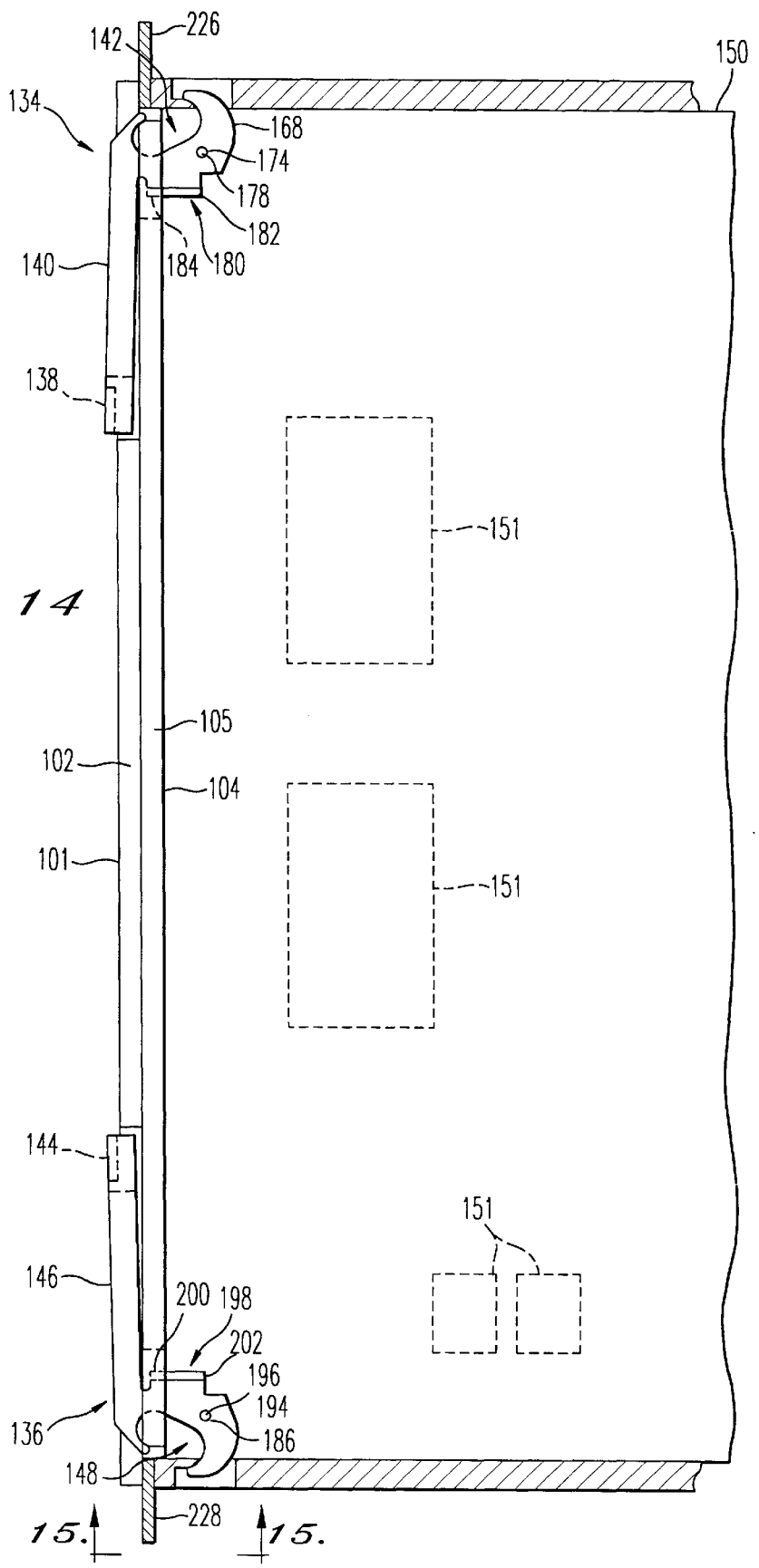
FIG. 14 is a plan view of the electronic circuit card assembly shown in FIGS. 3 and 4, taken from the side of the electronic circuit card opposite that to which components are mounted, with the latches of the faceplate assembly being positioned as shown in FIG. 13 and latching to the top and bottom designator strips of the circuit card housing shown in FIG. 9.

To latch the electronic circuit card assembly 212 into the circuit card housing 214, the top and bottom latches 134 and 136 are moved in the directions L1 and L2, respectively, as shown in FIG. 11, so that they assume the positions shown in FIGS. 13–15. When this occurs, pawl arrangements 142 and 148 engage with their respective latch areas (not shown) on designator strips 226 and 228, respectively, to secure the electronic circuit card assembly 152 to the designator strips 226 and 228, and thereby secure the electronic circuit card assembly 152 in the circuit card housing 214.

Furthermore, as the top and bottom latches 134 and 136 are pivoted about their respective pins 178 and 196 into the latched positions, the pawl arrangements 142 and 148 become oriented as indicated in FIG. 14. During this movement, the ramped portions 180 and 198 slide along surfaces 208 and 210, respectively, of the tabs 204 and 206, respectively, of movable plate 104. When this occurs, the ramped portions 180 and 198 act as a wedge or cam arrangement which translates the rotational forces and movement of the pawl arrangements 142 and 148 into forces which oppose the forces imposed on movable plate 104 by springs 110 and 112.

The movable plate 104 is therefore driven by ramped portions 180 and 198 in the direction M2 (FIGS. 13 and 15) such that the top edge 105 of movable plate 104 moves away from top 102 of faceplate 101. When the top and bottom latches 134 and 136 assume the latched positions as shown in FIGS. 13–15, the high ends 184 and 200 of ramped portions 180 and 198, respectively, are in contact with surfaces 208 and 210, respectively, of tab ends 204 and 206 of movable plate 104. Accordingly, the high ends 184 and 200 of ramped portions 180 and 198 position the top edge 105 of movable plate 104 at a maximum distance $D1_{max}$ (FIG. 13) from the top edge 102 of faceplate 101.

This distance $D1_{max}$ is sufficient to enable movable plate 104 to contact the faceplate 101-1 of an electronic circuit card assembly 152-1 inserted adjacent to electronic circuit card assembly 152 in circuit card housing 214 as shown, for example in FIGS. 16 and 17. As discussed above, faceplate 101 and movable plate 104 each include electrically conductive portions, or are made an electrically conductive material, so that the faceplate 101 and movable plate 104 are in electrical contact with each other. When the faceplate 104 comes in contact with 101-1 of the adjacent electronic circuit card assembly 152-1, the conductive portion of movable plate 104 electrically contacts the conductive portion of faceplate 101-1. Therefore, movable plate 104 creates an electroconductive shunt across the physical space 234 between faceplate 101 and adjacent faceplate 101-1 (as well as across the space between the conductive portions of faceplates 101 and 101-1, if the faceplates themselves are nonconductive), thereby eliminating EMI emissions through that space 234.

As additional electronic circuit card assemblies (e.g., 152-2 through 152-n in FIG. 9) are inserted into the circuit card housing 214 in the manner described above, the movable plates of the faceplate assemblies of those electronic circuit card assemblies are placed into contact with the faceplate assembly of their adjacently mounted electronic circuit card assembly. Accordingly, when all of the pairs of slotted openings 230 and 232 of the designator strips 226 and 228 have received an electronic circuit card assembly, the entire row of electronic circuit card assemblies are electrically coupled to each other via the movable plates and the designator strips 226 and 228. Hence, the row of electronic circuit card assemblies create a Faraday shield across the front of opening 218 in the circuit court housing 214, which blocks essentially all EMI emissions from that opening 218.

When an electronic circuit card assembly 152 is to be removed from circuit card housing 214, the top and bottom latches 134 and 136 are moved to the unlatched position as shown, for example, in FIGS. 10–12. Pawl arrangements 142 and 148 therefore disengage designator strips 226 and 228, respectively.

As the pawl arrangements 142 and 148 are rotated about pins 178 and 196, respectively, the ramped portions 180 and 198 slide along their respective services 208 and 210 of tab ends 204 and 206, respectively, of movable plate 104 until the low ends 182 and 202 are in contact with surfaces 208 and 210, respectively. This enables the forces imposed on movable plate 104 by springs 110 and 112 to move movable plate 104 in the direction indicated by arrow M1 (see FIGS. 2 and 10), which positions the free edge 105 of movable plate at the distance $D1_{min}$ (FIGS. 10 and 12) from the edge of 102 of faceplate 101.

Hence, movable plate 104 is moved out of contact with the faceplate 101-1 of the adjacently inserted electronic circuit card assembly 152-1. The electronic circuit card assembly 152 can then be pulled out of opening 218 by exerting a force on, for example, faceplate assembly 100 in a direction opposition to that indicated by arrow LOAD in FIG. 9.

Figure 18:
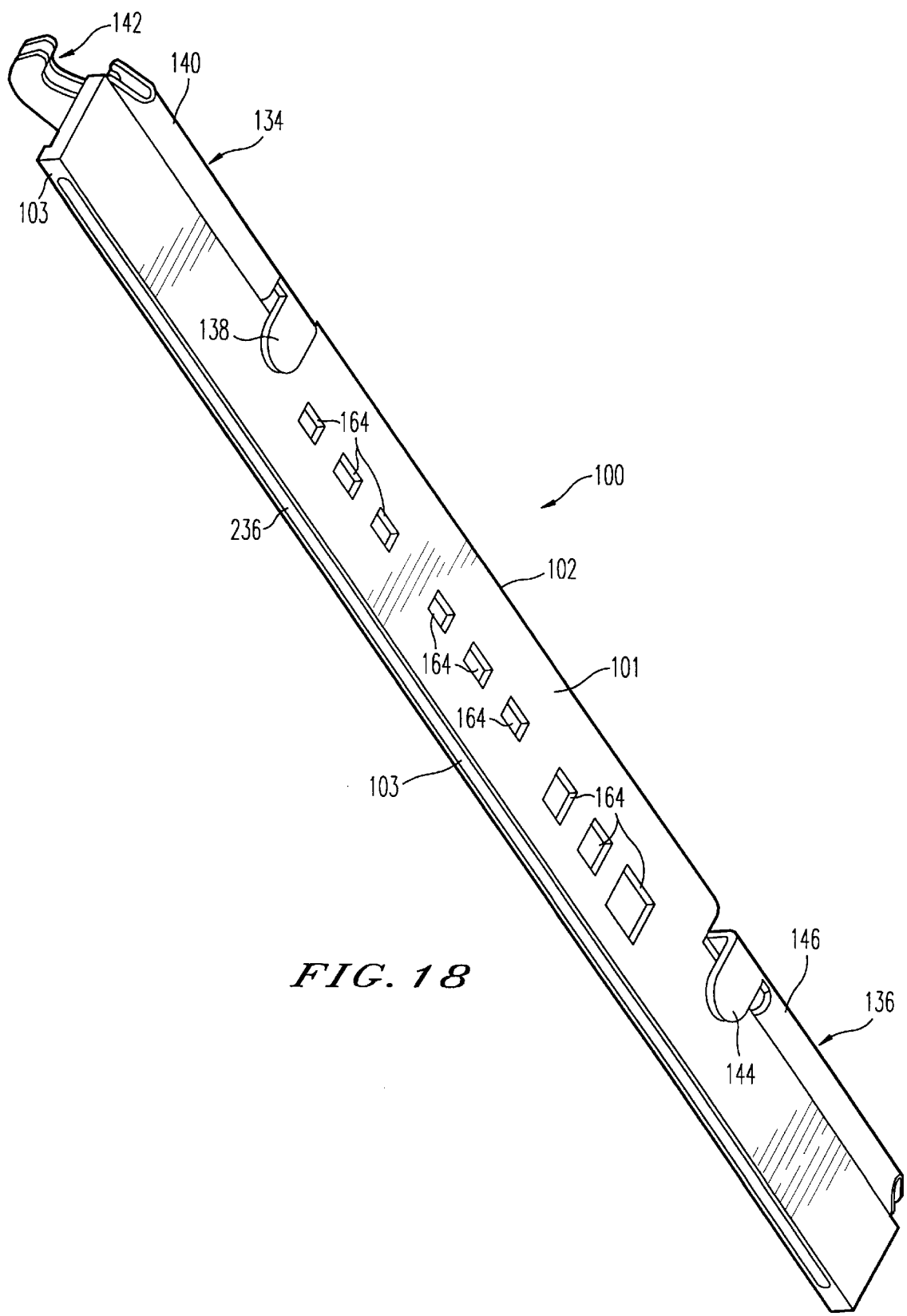
FIG. 18 is a rear perspective view of the faceplate assembly as shown in FIGS. 1 and 2 with an edge of its faceplate being modified to include a slotted opening therein.

Several modifications can be made to the faceplate assembly 100 which still enable the faceplate assembly 100 to function as described above to block EMI emissions through the space between adjacent circuit card assembly faceplates. For example, as shown in FIG. 18, the thickness of the bottom edge 103 of faceplate 101 can be modified to be sufficient to include a slotted opening 236 therein having a length and width sufficient to receive a movable plate 104 of another electronic circuit card assembly 152.

Figure 19:
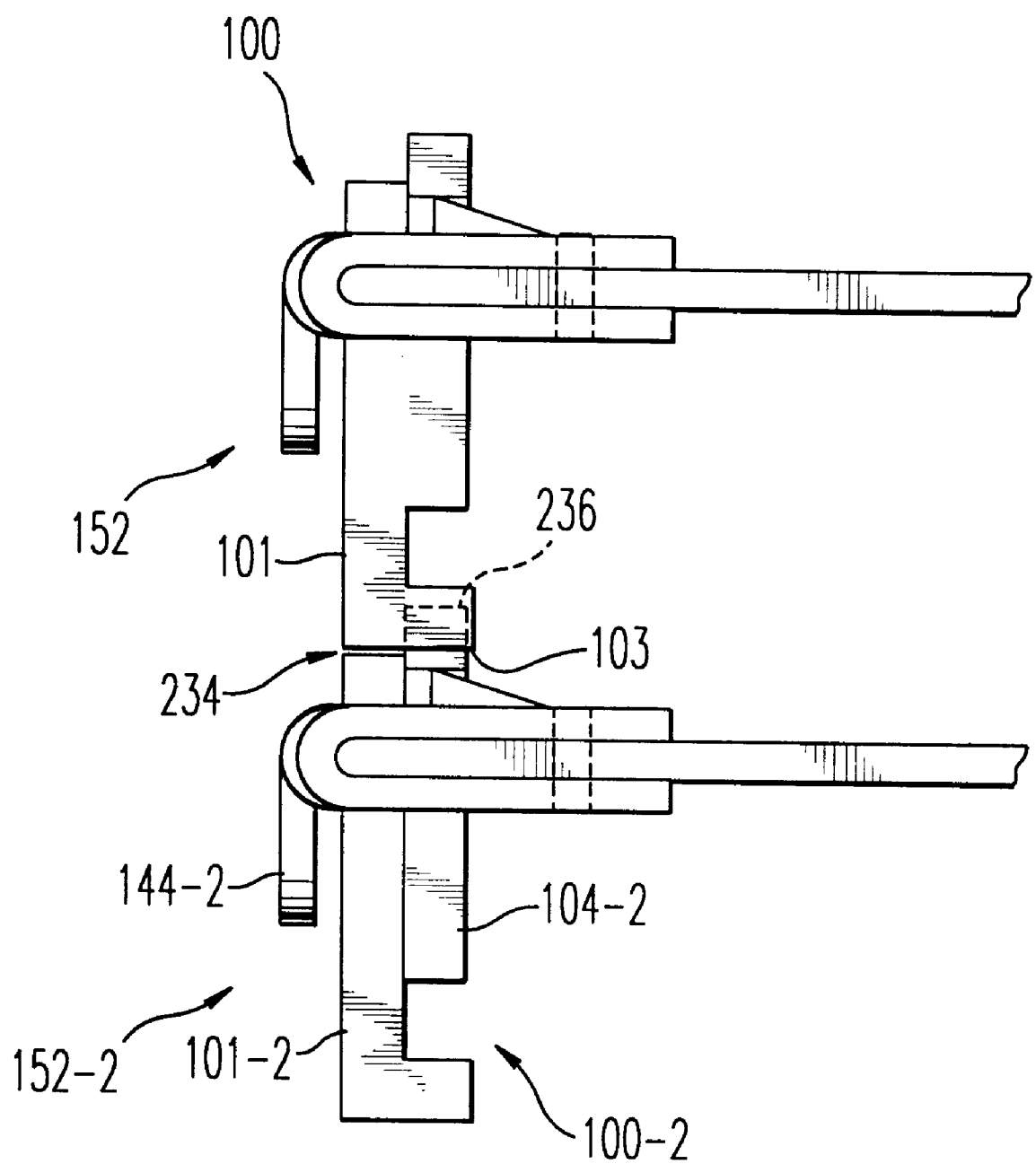
FIG. 19 is a schematic view illustrating engagement of a movable plate of the faceplate assembly of the electronic circuit card assembly shown in FIGS. 3 and 4 with the modified faceplate shown in FIG. 18.

Therefore, when an adjacently inserted electronic circuit card assembly 152-2 is latched into the circuit card housing 214 in the manner described above with regard to electronic circuit card assembly 152, the movable plate 104-2 of that adjacently inserted electronic circuit card assembly 152-2 projects into slotted opening 236 of modified faceplate 101 of electronic circuit card assembly 152 as shown in FIG. 19. This creates a tongue-and-groove arrangement between the faceplate assemblies of electronic circuit card assemblies 152 and 152-2, which improves the mechanical coupling of those two electronic circuit card assemblies while also maintaining electrical coupling between their faceplate assemblies 100 and 100-2.

Although movable plate 104 is shown as being coupled along edge 102 of faceplate 101, the faceplate assembly 100 can be configured so that movable plate 104 is coupled along edge 103 of faceplate 101, and functions in a manner similar to that described above. Furthermore, movable plate 104 need not be actuated by latches 134 and 136, but rather could be configured to be manually slidable with respect to faceplate 101 between the extended and retracted positions.

Additionally, the edge 102 (or edge 103) of faceplate along which movable plate 104 is coupled can include an opening therein having a length and width sufficient to receive at least a portion of movable plate 104, or even all of movable plate 104, when movable plate 104 is in the retracted position. When movable plate 104 is in the extended position, at least a portion of movable plate 104 protrudes from the opening and beyond the edge 102 (or 103) of faceplate 101.

Alternatively, as shown in FIG. 20–31, the springs 100 and 110 can be configured to urge the movable plate 104 away from faceplate 101. In this event, the top and bottom latches 134 and 136 are configured to allow the springs to urge the movable plate 104 away from faceplate 101 when in the latched position, and exert a force on movable plate 104 opposing the forces exerted by the springs when the top and bottom latches 134 and 136 are in the unlatched position, to urge movable plate 104 toward the faceplate 101.

Figure 20:
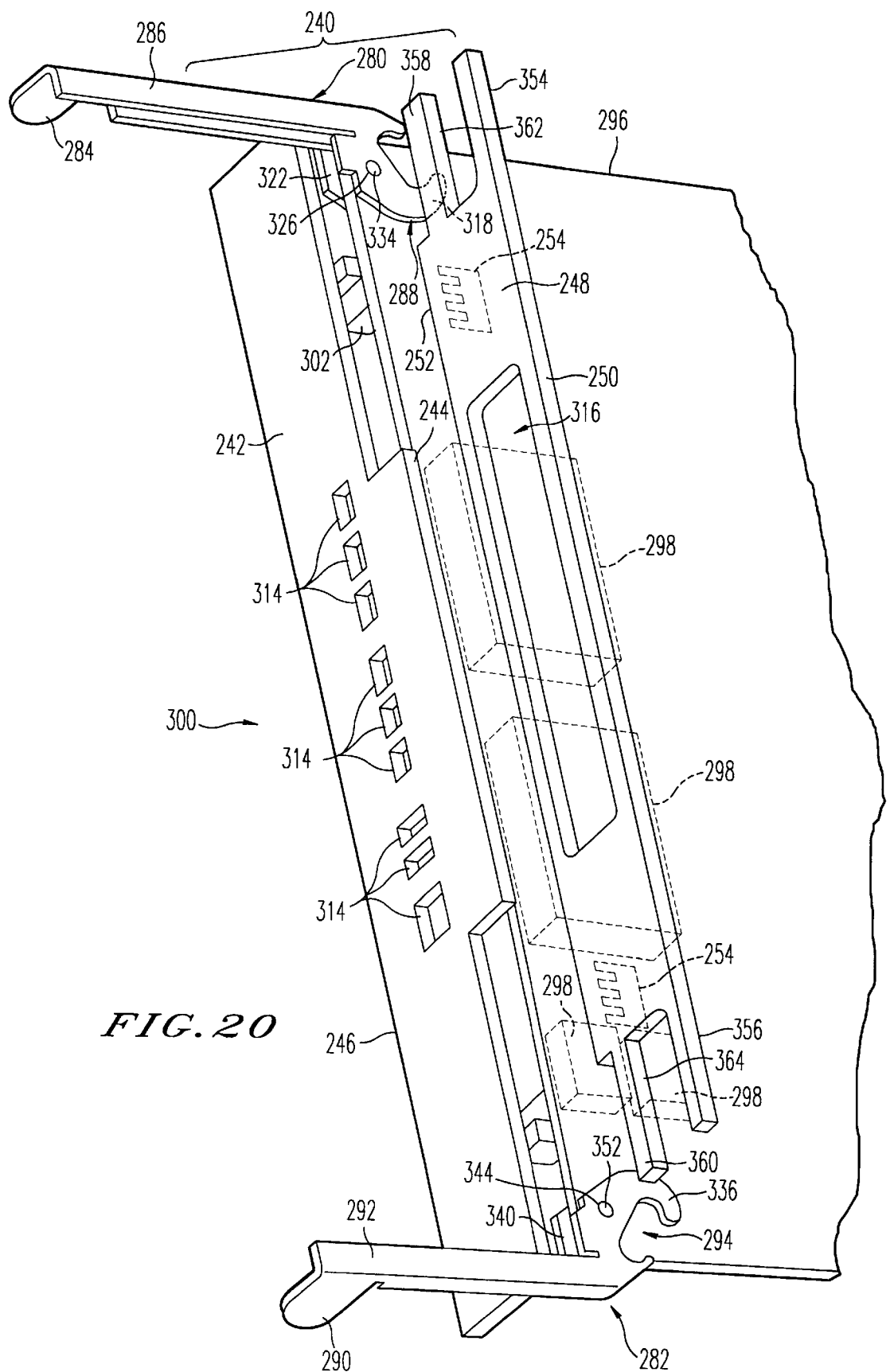
FIG. 20 is an exploded front perspective view of a faceplate assembly according to another embodiment of the present invention, attached to an electronic circuit card to form an electronic circuit card assembly.
Figure 21:
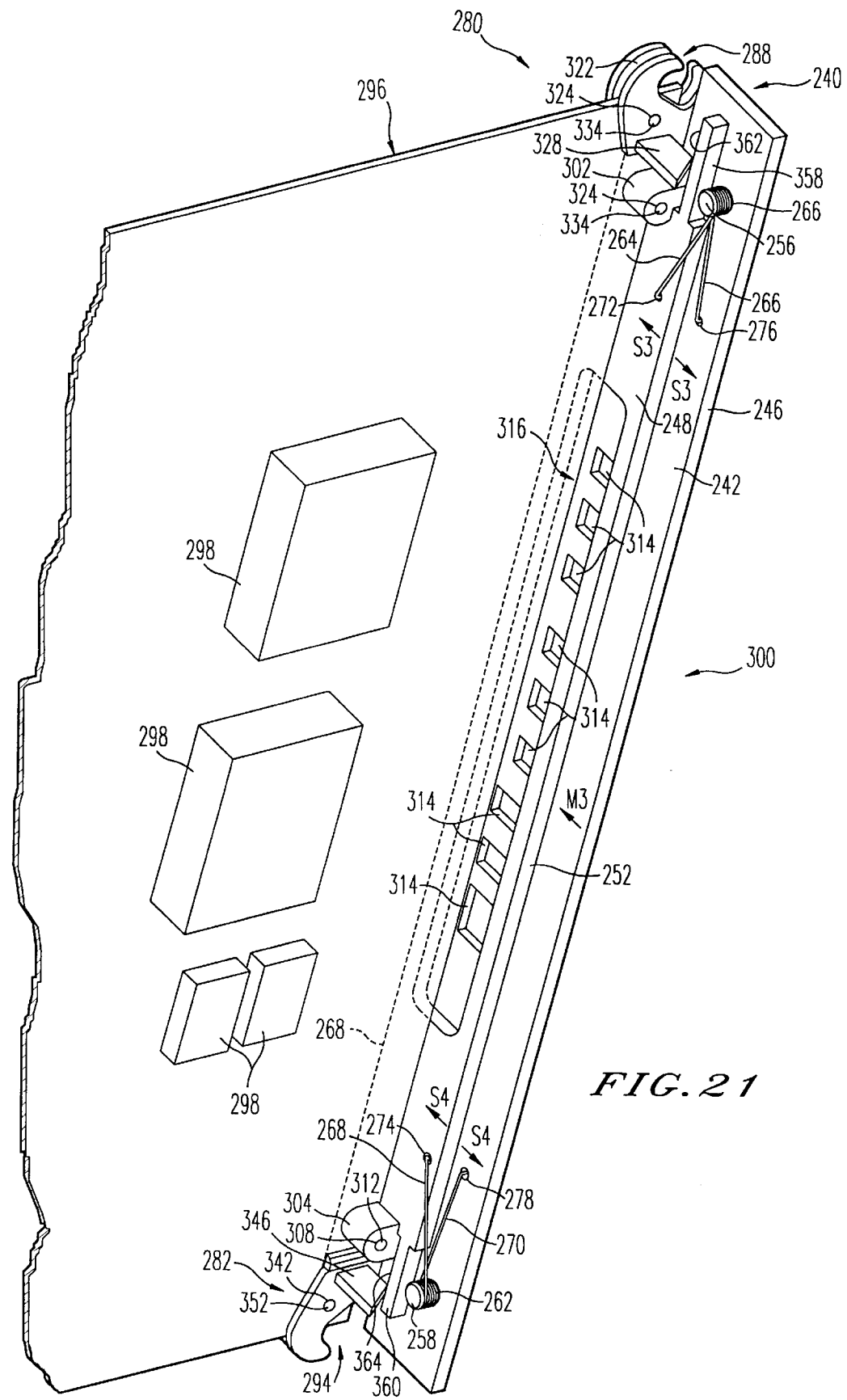
FIG. 21 is a rear perspective view of the electronic circuit card assembly shown in FIG. 20.

That is, as shown in FIGS. 20 and 21, the faceplate assembly 240 according to this embodiment includes a faceplate 242, similar to faceplate 101, which has a first edge 244 and a second edge 246. The faceplate assembly 240 further includes a movable plate 248 having a free edge 250 and a secured edge 252. The length of movable plate 248 can be any fraction of the length of faceplate 242 which would enable movable plate 248 to achieve its intended purpose as described below.

Like faceplate 101 and movable plate 104, faceplate 242 and movable plate 248 each can include, for example, a non-conductive base made of, for example, plastic or composite, having electrically conductive portions or strips attached thereto, or could each be made entirely or essentially entirely from an electrically conductive material such as metal, conductive plastic or the like. Also, faceplate 242 can include, for example, metal strip arrangements such as those described in U.S. Pat. No. 5,386,346 to Wilfred L. Gleadall, U.S. Pat. No. 5,491,613 to Eric M. Petitpierre, and U.S. Pat. No. 5,463,532 to Eric M. Petitpierre and John E. Holmes, cited above. In any event, the electrically conductive portions of faceplate 242 and movable plate 248 remain in electrical contact with each other regardless of the position of the movable plate 248 as described in more detail below.

As with faceplate assembly 100, to aid in establishing and maintaining electrical contact between the electrically conductive portions of faceplate 242 and movable plate 248, resilient electrically conductive strips 254, such as those described above which are made of a beryllium copper alloy or similar material, could be mounted to the faceplate 242, movable plate 248, or both, as shown in phantom in FIGS.

20 and 21. However, to minimize the likelihood of injury to a person handling the faceplate assembly 240, the conductive strips 254 are positioned such that they are sandwiched between the faceplate 242 and movable plate 248, and are thus essentially hidden from access by a user.

The faceplate assembly 240 includes posts 256 and 258 made, for example, of metal or any other suitable materials, and which are, for example, pressed into respective openings (not shown) on the back side of faceplate 242, or integral with faceplate 242 The faceplate assembly 240 further includes springs 260 and 262, which are mounted to posts 256 and 258, respectively. Spring 260 includes legs 264 and 266, and spring 262 includes legs 268 and 270. As shown in detail, for example, in FIG. 21, the distal end of leg 264 is received into an opening 272 in movable plate 248, and the distal end of leg 268 of spring 262 is received into an opening 274 in movable plate 248. Similarly, the distal end of leg 266 of spring 260 is received into an opening 276 in faceplate 242, and the distal end of leg 270 of spring 262 is received into an opening 278 in faceplate 242.

Unlike springs 110 and 112 described above, in this embodiment, spring 260 is configured so that its legs 264 and 266 are urged away from each other. Likewise, spring 262 is configured so that its legs 268 and 270 are urged away from each other. Springs 260 and 272 therefore slidably couple movable plate 248 to faceplate 242, and urge movable plate 248 and faceplate 242 away from each other in the directions indicated by arrows S3 and S4 in FIG. 21. If faceplate 242 is maintained stationary, springs 260 and 262 urge movable plate 248 in the direction indicated by arrow M3 in FIG. 21. That is, springs 260 and 262 urge the free edge 250 of movable plate 248 away from the edge 244 of faceplate 242, and likewise urge the secured edge 252 of movable plate 248 away from the edge 246 of faceplate 242. Movement of movable plate 248 by the force of springs 260 and 262 is limited as discussed in more detail below.

Faceplate assembly 242 further includes a top latch 280 and a bottom latch 282, which are similar to top and bottom latches 134 and 136 as described above. Latch 280 includes a tab 284, a shaft 286 and a pawl arrangement 288. Similarly, bottom latch 282 includes a tab 290, a shaft 292 and a pawl arrangement 294.

As shown in FIGS. 20 and 21, the faceplate assembly 242 is adapted to be connected to an electronic circuit card 296, which can be similar to electronic circuit card 150 discussed above, and includes components 298 mounted thereon, such as those used in telephone channel banks as described above in the background section. The faceplate assembly 242 and electronic circuit card 296 form an electronic circuit card assembly 300. The faceplate 242 includes mounting blocks 302 and 304 which can be similar to mounting blocks 153 and 154 described above in that they could be made of metal or any other suitable material, and are mounted to the faceplate 242 by press-fitting, rivets, screws, pins, or any other suitable fastening device. The mounting blocks 302 and 304 also can be integral with the faceplate 242.

Mounting blocks 302 and 304 include openings 306 and 308 therein, respectively. As shown in FIG. 21, in particular, openings 306 and 308 receive pins 310 and 312, respectively, which are fastened to the electronic circuit card 296 by any suitable manner, and therefore connect the electronic circuit card 296 to the faceplate 242. The pins 310 and 312 themselves can be any suitable fastening member, such as screws, rivets, posts, or the like. The faceplate 242 includes openings 314 having various sizes and shapes for accommodating components on the electronic circuit card 296, such as LEDs, plugs, switches, and the like. Likewise, movable plate 248 includes an opening 316 therein which allows those components on the electronic circuit card 296 to be viewed or accessible through openings 314 in the faceplate 242.

The top and bottom latches 280 and 282, respectively, are also connected to the electronic circuit card 296. That is, as shown in FIGS. 22 and 23, the pawl arrangement 288 of top latch 280 includes an outer pawl 318 and an inner pawl 320 which are separated by a space 322. The inner pawl 320 includes an opening 324 therein which is aligned with or substantially aligned with a similar opening 326 (see FIG. 20) in outer pawl 318. As further shown in FIG. 21, and in more detail in FIGS. 22 and 23, inner pawl 320 of top latch 280 includes a ramped portion 328 having a low end 330 and a high end 332, the significance of which is described in detail below. As with the ramped portions 180 and 198 discussed above, ramped portion 328 could be curved, spiral, helical, or any other suitable shape which would acheive the purpose described below.

To mount the top latch 280 to the electronic circuit card 296, an edge of the electronic circuit card 296 is received into opening 322 as shown, for example in FIGS. 20 and 21. A pin 334, such as a rivet, pin, screw, or any other suitable pin-like fastener, is passed through opening 324, through an opening (not shown) in electronic circuit card 296, and through opening 326, and is secured into openings 324 and 326 by any suitable method, such as press-fitting, screwing, an adhesive, crimping, or the like. The pin 334 therefore pivotally couples the top latch 280 to the electronic circuit card 296 between a latched position and an unlatched position, the details and significance of which are described below.

As shown in detail in FIGS. 24 and 25, the pawl arrangement 294 of bottom latch 282 includes an outer pawl 336 and an inner pawl 338 that are separated by a space 340. The inner pawl 338 has an opening 342 therein which is aligned or substantially aligned with a similar opening 344 (see FIG. 20) in outer pawl 336. As further shown in detail in FIGS. 24 and 25, inner pawl 338 includes a ramped portion 346 having a high end 348 and low end 350, the significance of which is described in more detail below. As with the ramped portions 180 and 198 discussed above, ramped portion 346 could be curved, spiral, helical, or any other suitable shape which would acheive the purpose described below.

As shown in FIGS. 20 and 21, when the bottom latch 282 is mounted to the electronic circuit card 296, an edge of electronic circuit card 296 is received into space 340. A pin 352, similar in configuration to pin 334 described above, is received into openings 342 and 344 in inner pawl 338 and outer pawl 336, respectively, and through an opening (not shown) in electronic circuit card 296. The pin 352 is secured in openings 342 and 344 in a manner similar to that in which pin 334 is secured in openings 324 and 326 as described above. Therefore, pin 352 pivotally couples bottom latch 282 to electronic circuit card 296.

As shown in FIG. 20, in particular, movable plate 248 includes tabs ends 354 and 356, which are similar to tab ends 204 and 206 of movable plate 104 described above. However, movable plate 248 further includes tab ends 358 and 360. Tab end 358 has a surface 362 which is contacted by different areas of the ramped portion 328 as the top latch 280 is pivoted about pin 334, as described in more detail below. Similarly, tab end 356 has a surface 364 which is contacted by different areas of ramped portion 346 as the bottom latch 282 is pivoted about pin 352 as described in more detail below.

Figure 26:
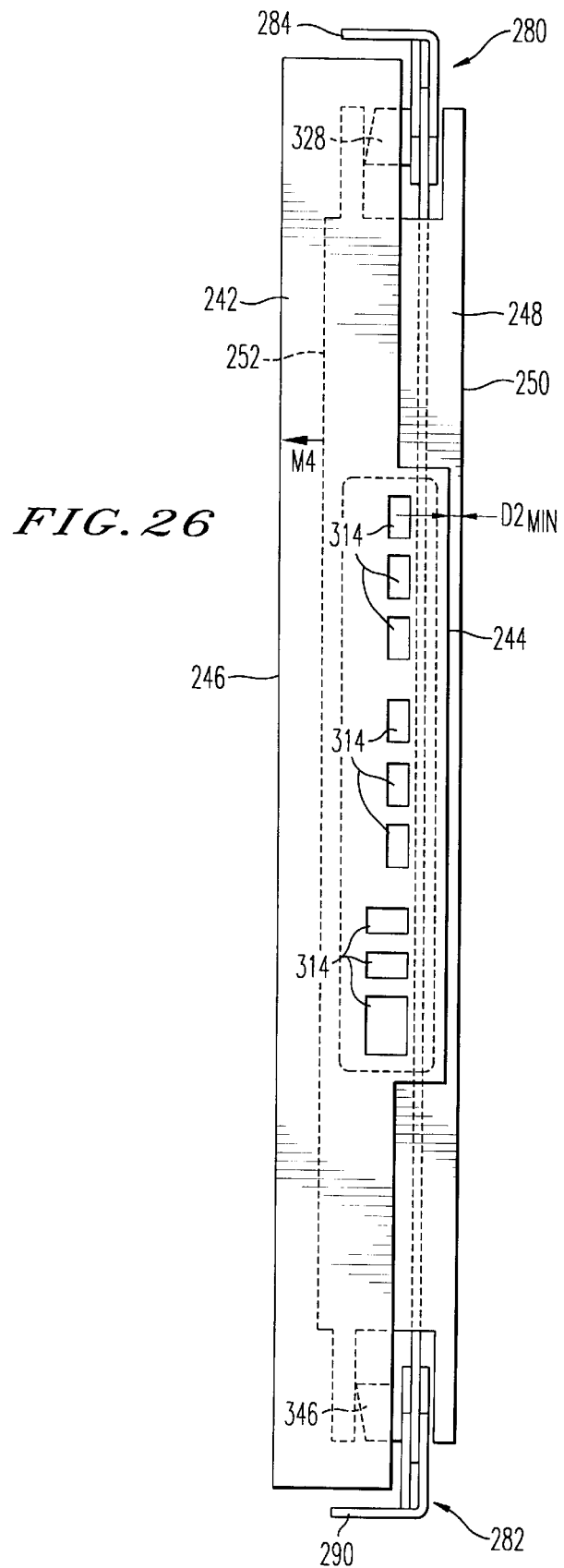
FIG. 26 is a front view of the electronic circuit card assembly shown in FIG. 21 with the top and bottom latches of its faceplate assembly being in their unlatched positions.
Figure 27:
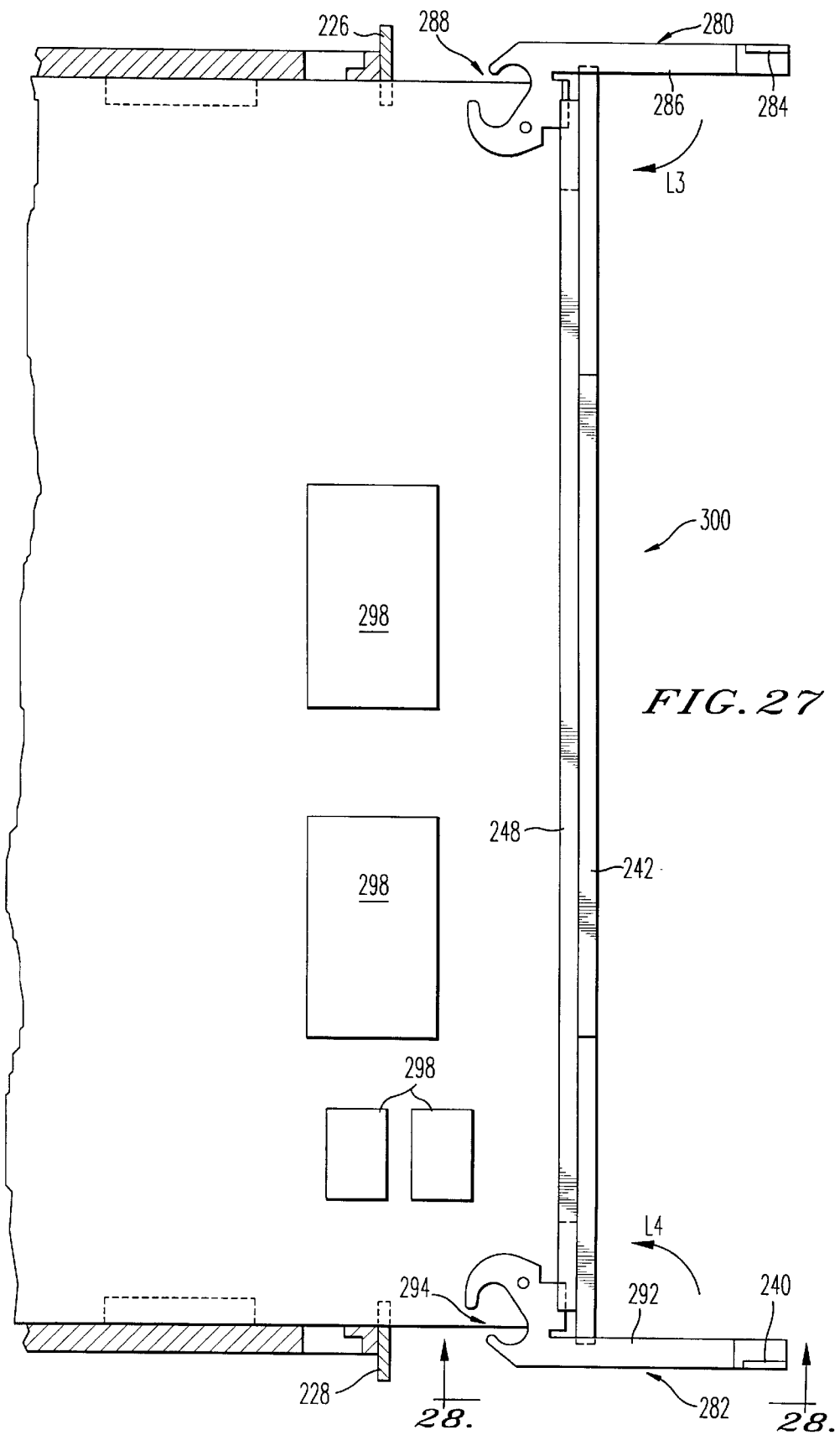
FIG. 27 is a plan view of the electronic circuit card assembly shown in FIG. 21, taken from the side of the electronic circuit card on which components are mounted, with the latches of the faceplate assembly being positioned as shown in FIG. 26 for engagement with the top and bottom designator strips of the circuit card housing shown in FIG. 9.
Figure 28:
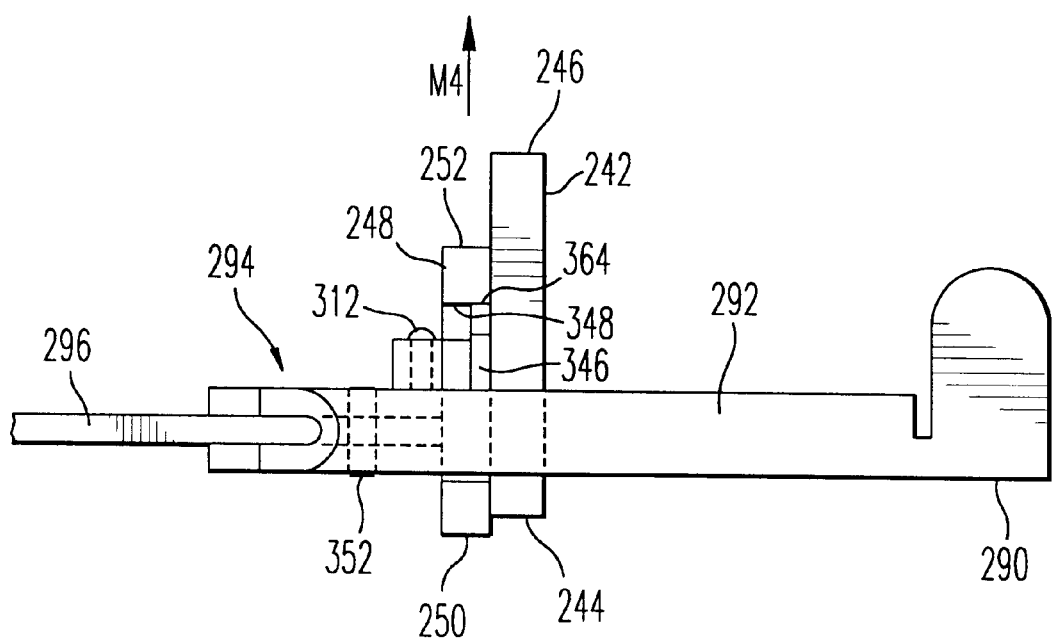
FIG. 28 is an end view of the electronic circuit card assembly as taken along lines 28—28 in FIG. 27.
Figure 31:
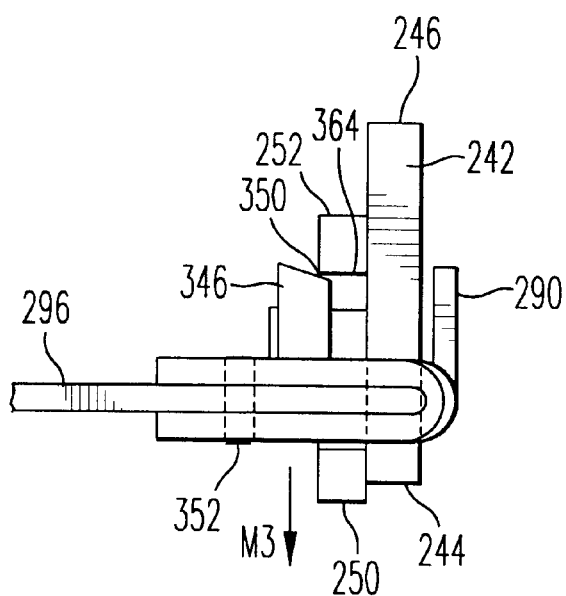
FIG. 31 is an end view of the electronic circuit card assembly taken along lines 31—31 in FIG. 30.

In a manner similar to electronic circuit card assembly 152 described above, electronic circuit card assembly 300 can be inserted into a circuit card housing 214 as shown in FIG. 9. When the electronic circuit card assembly 300 is made ready for insertion into circuit card housing 214, the top and bottom latches 280 and 282 are preferably positioned as shown in FIGS. 26–28 so that their shafts 286 and 292 each extend outwardly from faceplate 242 at an angle of 90° or substantially 90° from the front surface of faceplate 242.

In this position, the pawl arrangements 288 and 294 are oriented about pins 334 and 352, respectively, as shown so that the high ends 332 and 348 of ramped portions 328 and 346, respectively, contact surfaces 362 and 364, respectively, of tabs ends 358 and 360 of movable plate 248. The ramped portions 328 and 346 therefore each act as a wedge or cam arrangement which exerts a force on movable plate 248 in the direction M4 (see FIGS. 26 and 28) opposite to the force exerted on movable plate 248 in the direction M3 (see FIG. 21) by springs 260 and 262.

The forces exerted by ramped portions 328 and 346 thus drive movable plate 248 in the direction M4, which allows movable plate 248 to slide in that same direction with respect to faceplate 242 until the free edge 250 of movable plate 248 is at a minimum distance $D2_{min}$ (FIG. 26) from the edge 244 of faceplate 242. This minimum distance $D2_{min}$ is sufficient to allow the free edge 250 of movable plate 248 to avoid contact with the faceplate of an electronic circuit card assembly that has been inserted in the circuit card housing 214 in a position adjacent to that in which electronic circuit card assembly 300 is being inserted in a manner similar to that discussed above with regard to electronic circuit card assembly 152.

As with electronic circuit card assembly 152 discussed above, the electronic circuit card assembly 300 is slid into the opening 218 in the circuit card housing 214 in the direction LOAD as shown in FIG. 9, until the back of faceplate 242 contacts designator strips 226 and 228. Slotted openings 230 and 232 each have a width sufficient to receive pawl arrangements 288 and 294, respectively, therein. The faceplate 242 of the electronic circuit card assembly 300 therefore creates an electroconductive shunt across opening 218.

The electronic circuit card assembly 300 can then be latched into the circuit card housing 214 in a manner similar to electronic circuit card housing 152. The top and bottom latches 280 and 282 are moved in the directions L3 and L4, respectively, as shown in FIG. 27, so that they assume the positions shown in FIGS. 29–31. When this occurs, pawl arrangements 288 and 294 engage with their respective latch areas (not shown) on designator strips 226 and 228, respectively, to secure the electronic circuit card assembly 300 to the designator strips 226 and 228, and thereby secure the electronic circuit card assembly 300 in the circuit card housing 214.

Figure 29:
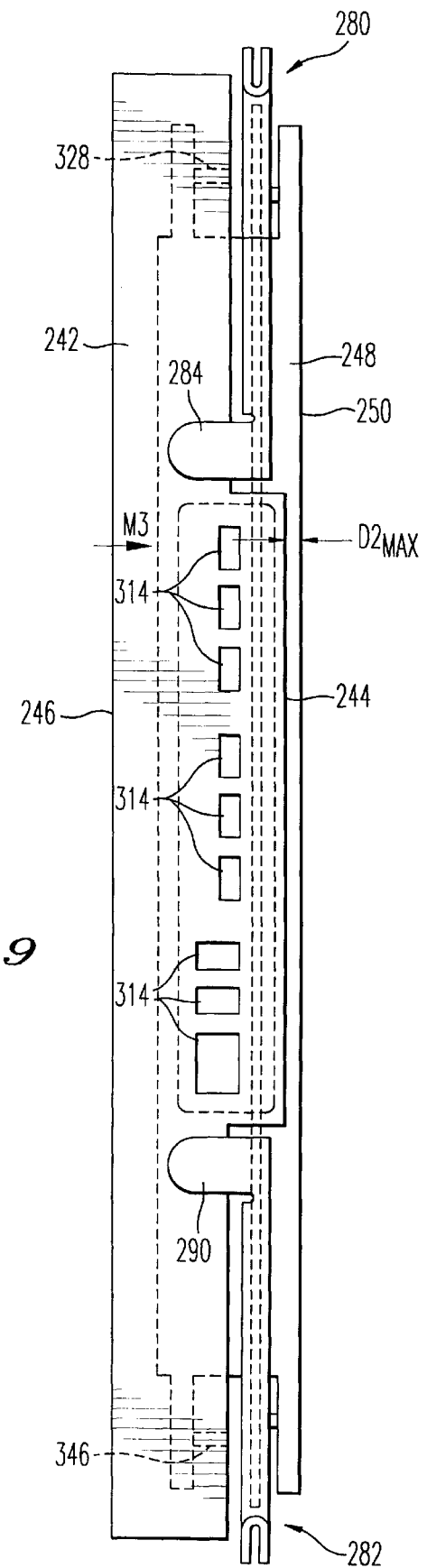
FIG. 29 is a front view of the electronic circuit card assembly as shown in FIG. 21 with the top and bottom latches being in their latched positions.
Figure 30:
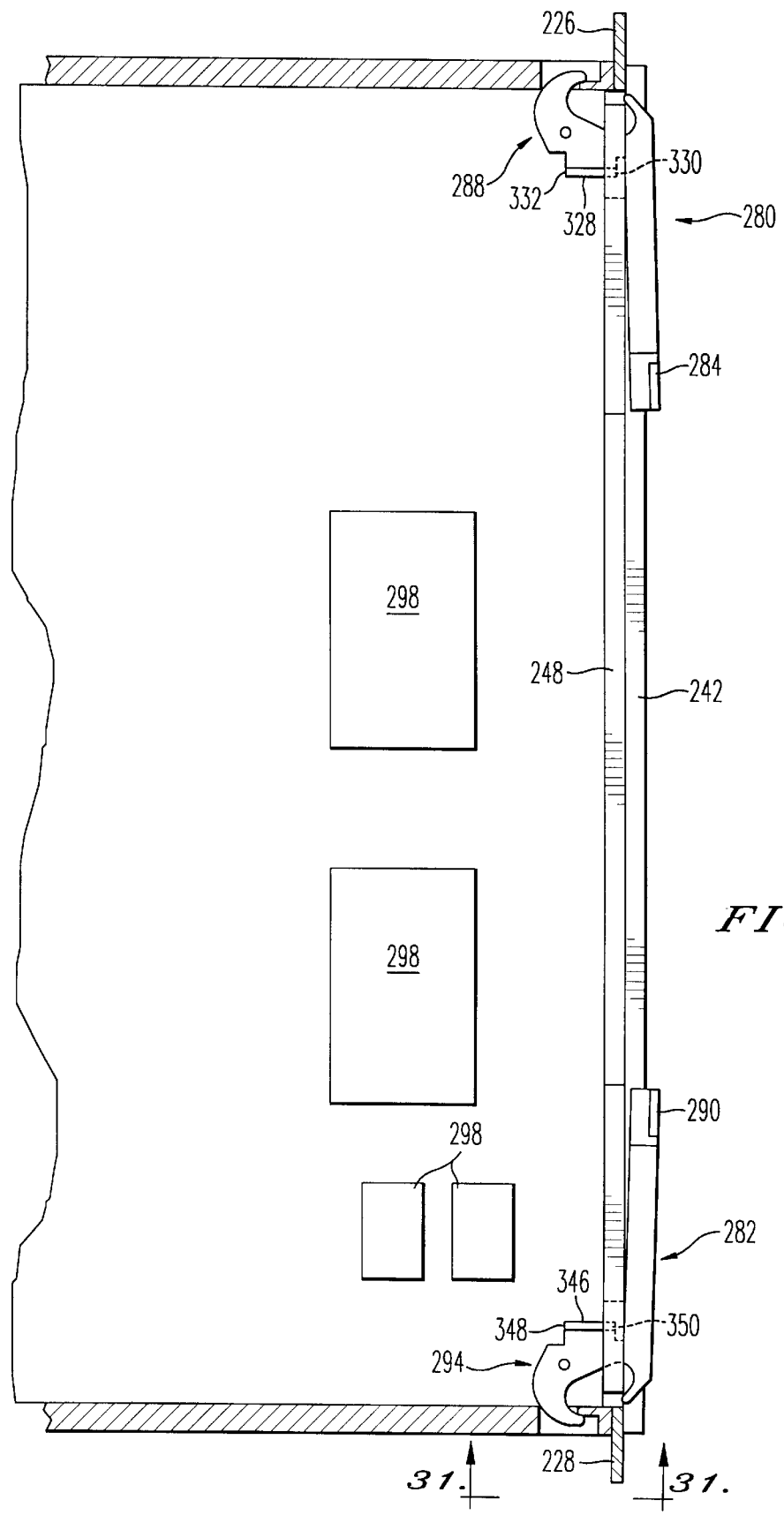
FIG. 30 is a plan view of the electronic circuit card assembly shown in FIG. 21, taken from the side of the electronic circuit card on which components are mounted, with the latches of the faceplate assembly being positioned as shown in FIG. 29 and latching to the top and bottom designator strips of the circuit card housing shown in FIG. 9.

As the top and bottom latches 280 and 282 are pivoted about their respective pins 334 and 352 into the latched positions, the pawl arrangements 288 and 292 become oriented as indicated in FIG. 30. During this movement, the ramped portions 328 and 246 slide along surfaces 362 and 364 of the tabs 358 and 360, respectively, of movable plate 248, until their lower ends 330 and 350, respectively, are in contact with the respective surfaces 362 and 364. This enables springs 260 and 262 to drive the movable plate 248 in the direction M3 (see FIGS. 21 and 31) such that the top edge 250 of movable plate 248 moves away from the edge 244 of faceplate 242 to a maximum distance $D2_{max}$ (FIG. 29).

This distance $D2_{max}$ is sufficient to enable movable plate 248 to contact the faceplate of an electronic circuit card assembly (not shown) inserted adjacent to electronic circuit card assembly 300 in circuit card housing 214 as discussed above with regard FIGS. 16 and 17 pertaining to electronic circuit card assembly 152. As discussed above, faceplate 242 and movable plate 248 each include electrically conductive portions, or are made an electrically conductive material, and are in electrical contact with each other.

Hence, when the movable plate 248 comes in contact with the faceplate of the adjacent electronic circuit card assembly, the conductive portion of movable plate 248 electrically contacts the conductive portion of the adjacent faceplate. Therefore, in a manner similar to movable plate 104 discussed above, movable plate 248 creates an electroconductive shunt across the physical space between faceplate 242 and the adjacent faceplate (as well as across the space between the conductive portions of faceplates if the faceplates themselves are non-conductive), thereby attenuating, and thus reducing EMI emissions through those spaces.

As with the electronic circuit card assemblies 152 through 152-n discussed above, as additional electronic circuit card assemblies 300 are inserted into the circuit card housing 214 in the manner described above, the movable plates of the faceplate assemblies of those electronic circuit card assemblies are placed into contact with the faceplate assembly of their adjacently mounted electronic circuit card assembly. Accordingly, when all of the pairs of slotted openings 230 and 232 of the designator strips 226 and 228 have received an electronic circuit card assembly, the entire row of electronic circuit card assemblies are electrically coupled to each other via the movable plates and the designator strips 226 and 228. Hence, the row of electronic circuit card assemblies creates a Faraday shield across the front of opening 218 in the circuit court housing 214, which attenuates, and thus reduces EMI emissions from that opening 218.

When an electronic circuit card assembly 300 is to be removed from circuit card housing 214, the top and bottom latches 280 and 282 are moved to the unlatched position as shown, for example, in FIGS. 26–28. Pawl arrangements 288 and 294 therefore disengage designator strips 226 and 228, respectively.

As the pawl arrangements 288 and 294 are rotated about pins 334 and 352, respectively, the ramped portions 328 and 346 slide along their respective surfaces 362 and 364 of tab ends 358 and 360, respectively, of movable plate 248 until the high ends 332 and 348 are in contact with surfaces 362 and 364, respectively. This forces movable plate 248 in the direction indicated by arrow M4 (see FIGS. 26 and 28), which positions the free edge 250 of movable plate at the distance $D2_{min}$ (FIG. 26) from the edge of 244 of faceplate 242.

Hence, movable plate 248 is moved out of contact with the faceplate of the adjacently inserted electronic circuit card assembly (not shown). The electronic circuit card assembly 300 can then be pulled out of opening 218 by exerting a force on, for example, faceplate assembly 242 in a direction opposition to that indicated by arrow LOAD in FIG. 9.

Although movable plate 248 is shown as being coupled along edge 244 of faceplate 242, the faceplate assembly 240 can be configured so that movable plate 248 is coupled along edge 246 of faceplate 242, and functions in a manner similar to that described above. Furthermore, movable plate 248 need not be actuated by latches 280 and 282, but rather could be configured to be manually slidable with respect to faceplate 242 between the extended and retracted positions.

The faceplate 242 can also be modified, as discussed above with regard to faceplate 101, to include a slotted opening, such as that shown in FIG. 18, having a length and width sufficient to receive a movable plate 248 of another electronic circuit card assembly 300. Also, the different types of circuit card assemblies 152 and 300 discussed above can be inserted in any combination into the circuit card housing 214, and their respective movable plates 104 and 248 will perform their intended functions as described above.

Additionally, the edge 244 (or edge 246) of faceplate 242 along which movable plate 248 is coupled can include an opening therein having a length and width sufficient to receive at least a portion of movable plate 248, or even all of movable plate 248, when movable plate 248 is in the retracted position. When movable plate 248 is in the extended position, at least a portion of movable plate 248 protrudes from the opening and beyond the edge 244 (or 246) of faceplate 101.

A faceplate assembly according to a further embodiment of the invention is illustrated in FIGS. 32–35. In particular, faceplate assembly 366 includes a faceplate 368 having edges 370 and 372 and made of a material or materials similar to faceplates 101 and 242 discussed above. The faceplate includes mounting blocks 374 and 376, which are similar to mounting blocks 152, 154, 302 and 304 described above, for mounting the faceplate 368 to an electronic circuit card 378, which is similar to electronic circuit cards 150 and 296 described above and includes circuit components 380 mounted thereon. The faceplate 368 further includes openings 382 for accommodating or providing access to certain components such as LEDs, switches, plugs, and the like mounted to electronic circuit card 378.

Faceplate assembly 366 further includes at least one movable plate, and, in this example, includes a plurality of movable plates 384, 386, 388, 390, 392 and 394, which are each pivotally mounted to the back of faceplate 368 by respective pivot members 396, 398, 300, 302, 404 and 406, which each can be a pin, screw, rivet or the like. Movable plates 384–394 have respective distal ends 408, 410, 412, 414, 416 and 418 as shown, the purposes of which are described in detail below. It is noted that for exemplary purposes, the size of movable plates 384–394 with respect to the faceplate 368 and, in particular, the extent that distal ends 408–418 extend from the edge 372 of faceplate 368 is exaggerated.

The movable plates 384–394 each can include a non-conductive base made of, for example, plastic or composite material having a conductive portion which is in electrical contact with the conductive portion of the faceplate 368, or movable plates 384–394 each can be made of conductive material such as metal, conductive plastic or the like. In any event, movable plates 384–394 remain in electrical contact with the conductive portion of faceplate 368 regardless of their positions.

Figure 32:
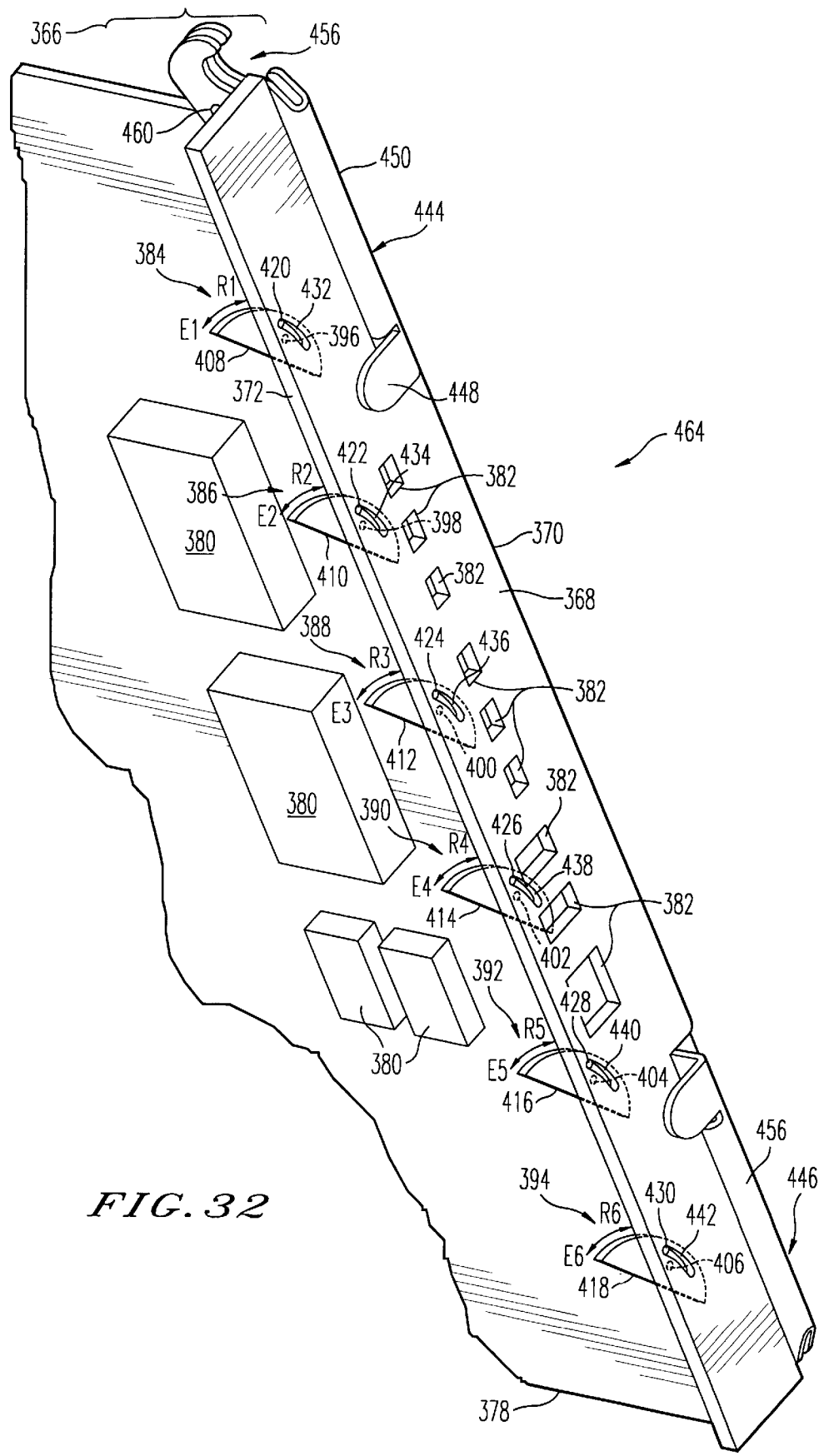
FIG. 32 is a front perspective view of a faceplate assembly according to another of the present invention, attached to an electronic circuit card to form an electronic circuit card assembly.
Figure 33:
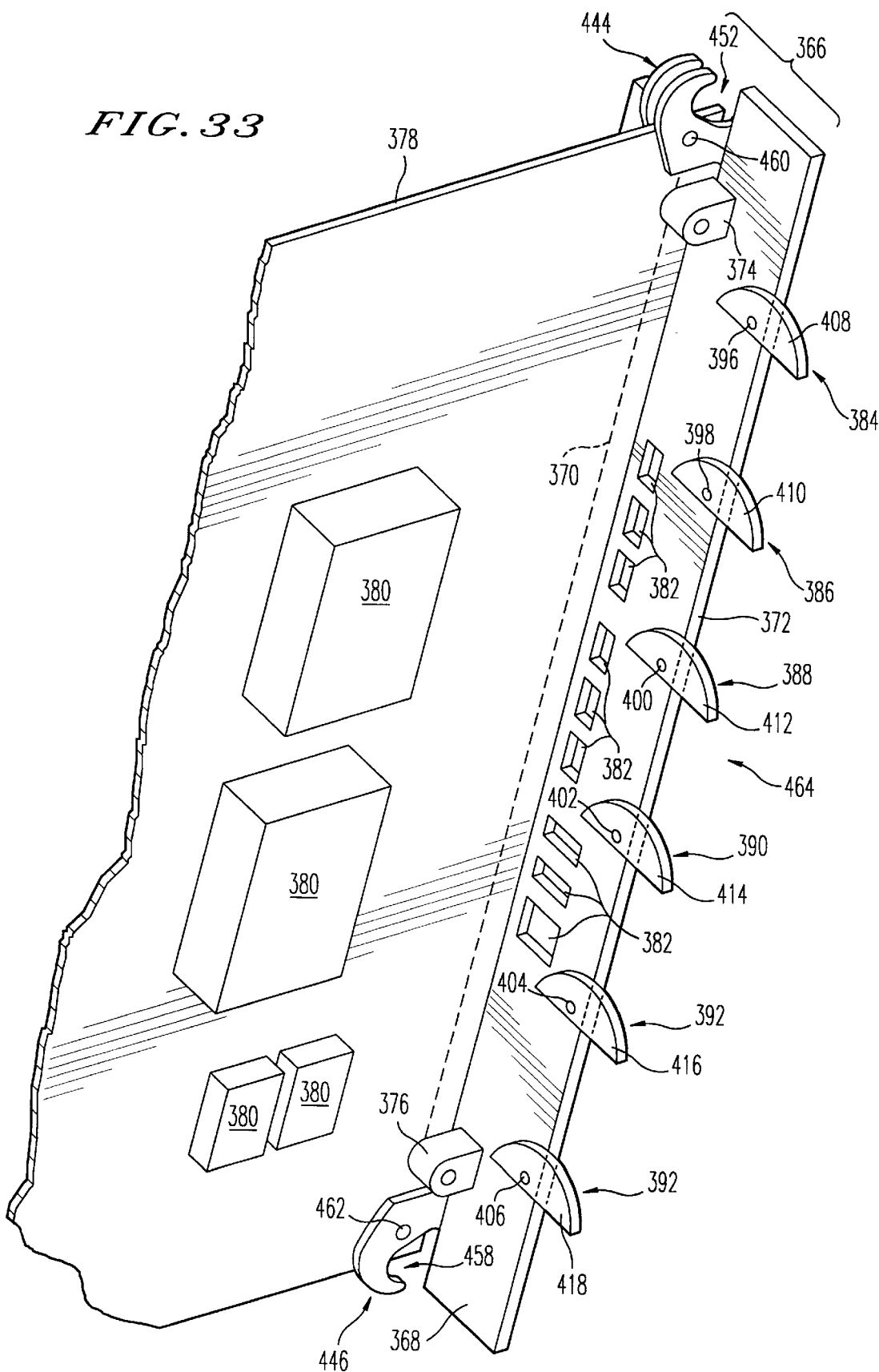
FIG. 33 is a rear perspective view of the electronic circuit card assembly shown in FIG. 32.

Each of the movable plates 384–394 further includes a respective actuating member 420, 422, 424, 426, 428 and 430, such as a pin or the like, which each extend through a respective slotted groove 432, 434, 436, 438, 440 and 442 in faceplate 368 and is accessible from the front of faceplate 368. Accordingly, as described in more detail below, force can be applied to actuating members 420–430 to pivot their respective movable plates 384–394 about their respective pivot members 396–406 between their respective extended positions E1–E6 and retracted positions R1–R6. The movable plates 384–394 are shown in FIGS. 32 and 33 in their respective extended positions E1–E6 where their distal ends 408–418 extend beyond the edge 372 of faceplate 368. In their retracted positions R1–R6, the distal ends 408–418 of movable plates 384–394 could extend slightly beyond the edge 372 of faceplate 368, be aligned with or substantially aligned with the edge 372, or be behind faceplate 368 so that no portion of any movable plate 384–394 extends beyond edge 372.

The faceplate assembly 366 further includes top latch 444 and bottom latch 446 which are generally similar in configuration to top and bottom latches 134 and 136, respectively, in that top latch 444 includes a tab 448, a shaft portion 450 and a pawl arrangement 452, and bottom latch 446 includes a tab 454, a shaft portion 456 and a pawl arrangement 458. Top and bottom latches 444 and 446 are pivotally mounted to the electronic circuit card 378 by pins 460 and 462, respectively, in a manner similar to that in which top and bottom latches 134 and 136 are mounted to circuit card 150. Hence, the top and bottom latches 444 and 446 can pivot between an unlatched position and a latched position in a manner similar to top and bottom latches 134 and 136.

The faceplate assembly 366, including top and bottom latches 444 and 446, and the electronic circuit card 378, form an electronic circuit card assembly 464. This electronic circuit card assembly 464 can be inserted into a circuit card housing 214 in a manner similar to that shown in FIG. 9 with regard to electronic circuit card assembly 212.

When electric circuit card assembly 464 is readied for insertion into circuit card housing 214, a force can be applied to actuating members 420–430 by, for example, a user's finger, to pivot movable plates 384–394 about their respective pivot members 396–406 in the directions toward retracted positions R1–R6, so that the movable plates 384–394 assume their respective retracted positions as described above. The top and bottom latches 444 and 446 can then be oriented as top and bottom latches 134 and 134 of electronic circuit card assembly 152 are shown, for example in FIGS. 10–12.

The electronic circuit card assembly 464 is aligned with the proper slotted openings 230 and 232 in the circuit card housing 214, and the electronic circuit card assembly 464 is slid into the circuit card housing 214. The top and bottom latches 444 and 446 engage with the designator strips 226 and 228, respectively, to latch the electronic card assembly 464 into the circuit card housing 214 in the manner similar to that described above with regard to electronic circuit card assembly 152.

Figure 34:
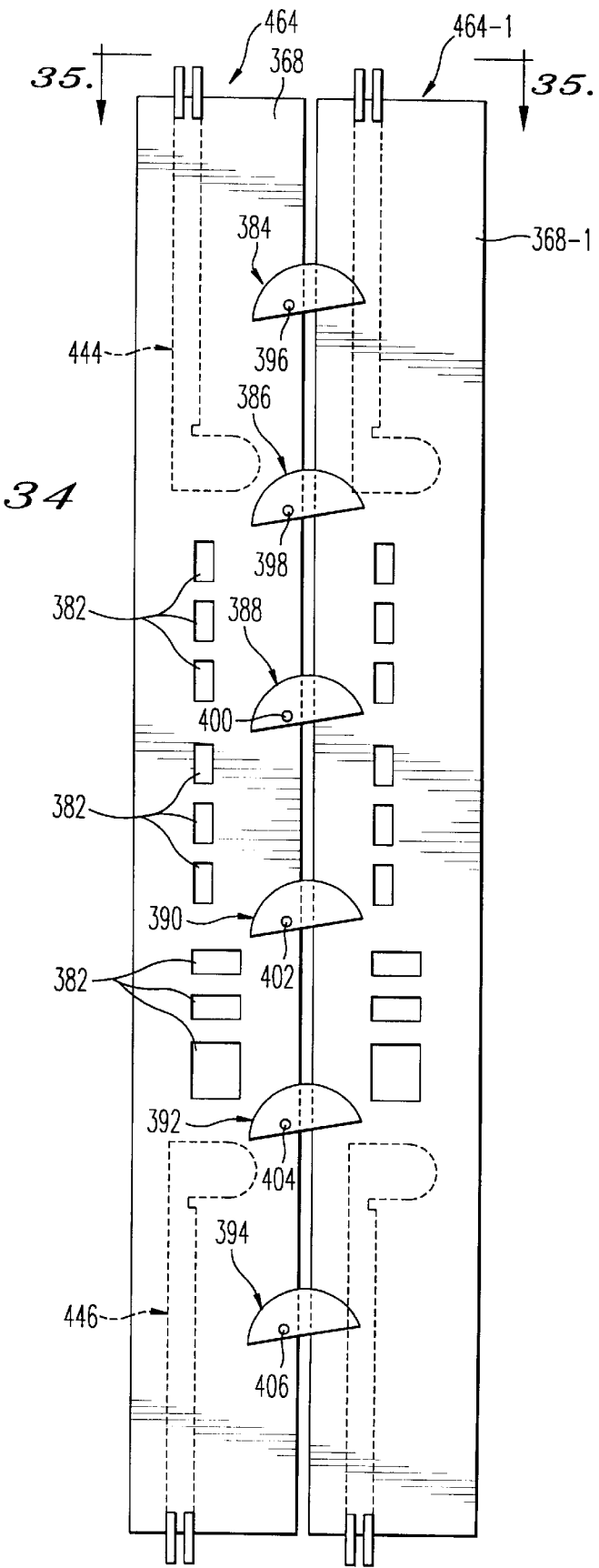
FIG. 34 is a rear view of the electronic circuit card assembly shown in FIG. 32 with the movable plates of its faceplate assembly engaged with a faceplate assembly of an electronic circuit card assembly adjacently inserted in a circuit card housing as shown in FIG. 9.
Figure 35:
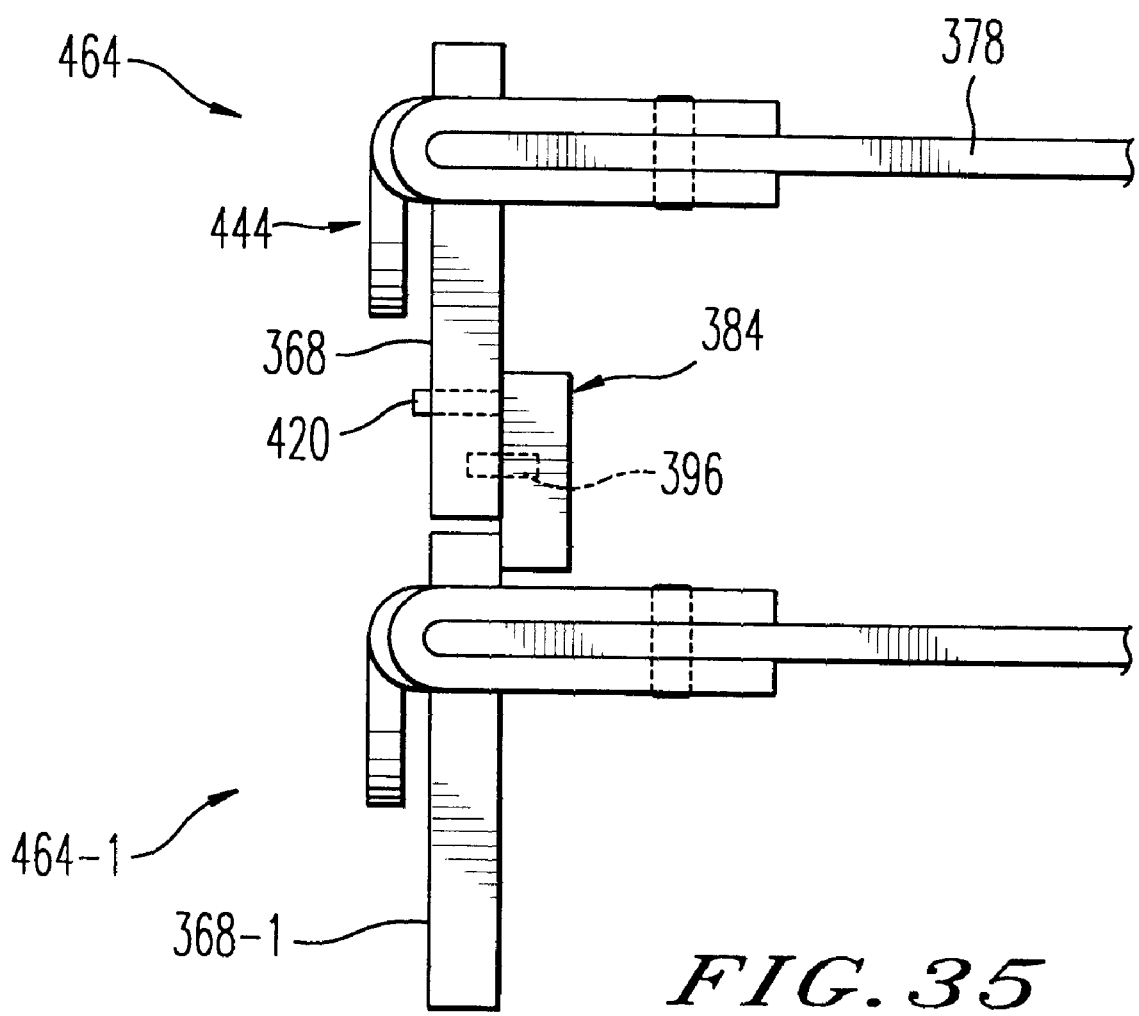
FIG. 35 is an end view as taken along lines 35—35 in FIG. 34.

However, in this embodiment, top and bottom latches 444 and 446 are not mechanically coupled to movable plates 384–394. Therefore, after the electronic circuit card assembly 464 has been latched into the circuit card housing 214, the movable plates 384–394 can be manually pivoted with respect to faceplate 368 toward their respective extended positions E1–E6 by applying force to their respective actuating members 420–430. Accordingly, as shown in FIGS. 34 and 35, the movable plates 384–394 can contact the back of a faceplate 368-1 of an adjacently inserted electronic circuit card assembly 432-1.

As discussed above, movable plates 384–394 each includes an electrically conductive portion which is in contact with the electrically conductive portion of faceplate 368 or, alternatively, movable plates 384–394 and faceplate 368 are each made substantially of a conductive material. In any event, movable plates 384–394 and faceplate 368 are in electrical contact with each other regardless of the pivot positions of movable plates 384–394. Hence, movable plates 384–394 contact at least the electrically conductive portion of faceplate 368-1 of adjacently inserted electronic circuit card assembly 464-1, and thus establish electrical contact between faceplate 368 and adjacent faceplate 368-1. The movable plates 384–394 therefore act as electrical conductive shunts across the space between faceplate 368 and faceplate 368-1 of adjacently inserted electronic circuit card assembly 464-1, thereby blocking EMI emissions through the space between faceplate 464 and adjacent faceplate 464-1.

When the electronic circuit card assembly 464 is to be removed from the electronic circuit card housing 214, force can be applied to the actuating members 420–430 to pivot their respective movable plates 384–394 about their respective pivot members 396–406, so that the distal ends 408–418 of movable plates 384–394 are moved out of contact with adjacent faceplate 368-1 of adjacently inserted electronic circuit card assembly 464-1. Accordingly, when the top and bottom latches 444 and 446 are moved to their unlatched positions, the electronic circuit card assembly 464 is released from circuit card housing 214, and thus can be pulled out of circuit card housing 214.

As described above, the faceplate assembly 366 can include a plurality of movable plates 384–394 as shown, or a single movable plate similar to movable plates 104 and 248 discussed above. The movable plate or plates need not pivot as illustrated, but can be manually slidable along respective grooves in the faceplate 368. Furthermore, although not shown, the plurality of movable plates 384–394 can be mechanically coupled to either or both top and bottom latches 444 and 446 so that they assume their retracted positions R1–R6 when the top or bottom latches 444 and 446, or both, are in their unlatched position, and assume their extended positions E1–E6 when the top or bottom latches 444 and 446, or both, are in their latched positions for latching the electronic circuit card assembly 464 into the circuit card housing 214.

Also, the edge 370 of faceplate 368 can include a slot or a plurality of slots (not shown) having a length and width sufficient to receive any number of movable plates 384–394 therein. Accordingly, the movable plate or plates of a faceplate of an electronic circuit card assembly inserted in circuit card housing 214 adjacent to electronic circuit card assembly 464 can be received into the slot or slots in edge 370 of faceplate 368, thereby creating a tongue-and-groove arrangement between the adjacent faceplates.

Furthermore, in an alternate embodiment (not shown), the faceplate assembly 366 can be configured so that the movable plates 384–394 are disposed along edge 370, instead of along edge 372 as shown. In this event, the distal ends 408–418 of movable plates 384–394 would extend beyond edge 370 in their extended positions, and either extend slightly beyond edge 370, align or substantially align with edge 370, or be behind faceplate 368 in their retracted positions.

Additionally, the edge 372 (or edge 370 as appropriate) of faceplate 368 along which movable plates 384–394 are coupled can include an opening therein having a length and width sufficient to receive at least a portion of each movable plate 384–394, or even all of movable plates 384–394, when movable plates 384–394 are in the retracted position. Also, that edge 372 (or 370) can include a plurality of openings each designated to receive a portion or all of a respective movable plage 384–394 in their retracted positions. When movable plates 384–394 are in their extended positions, at least a portion of each movable plate 384–394 protrudes from the opening (or respective openings) and beyond the edge 372 (or 370) of faceplate 368.

A faceplate assembly according to another embodiment of the present invention is shown in FIGS. 36–43. In this embodiment, the movable plate pivots with respect to the faceplate to assume the retracted and extended positions.

Figure 36:
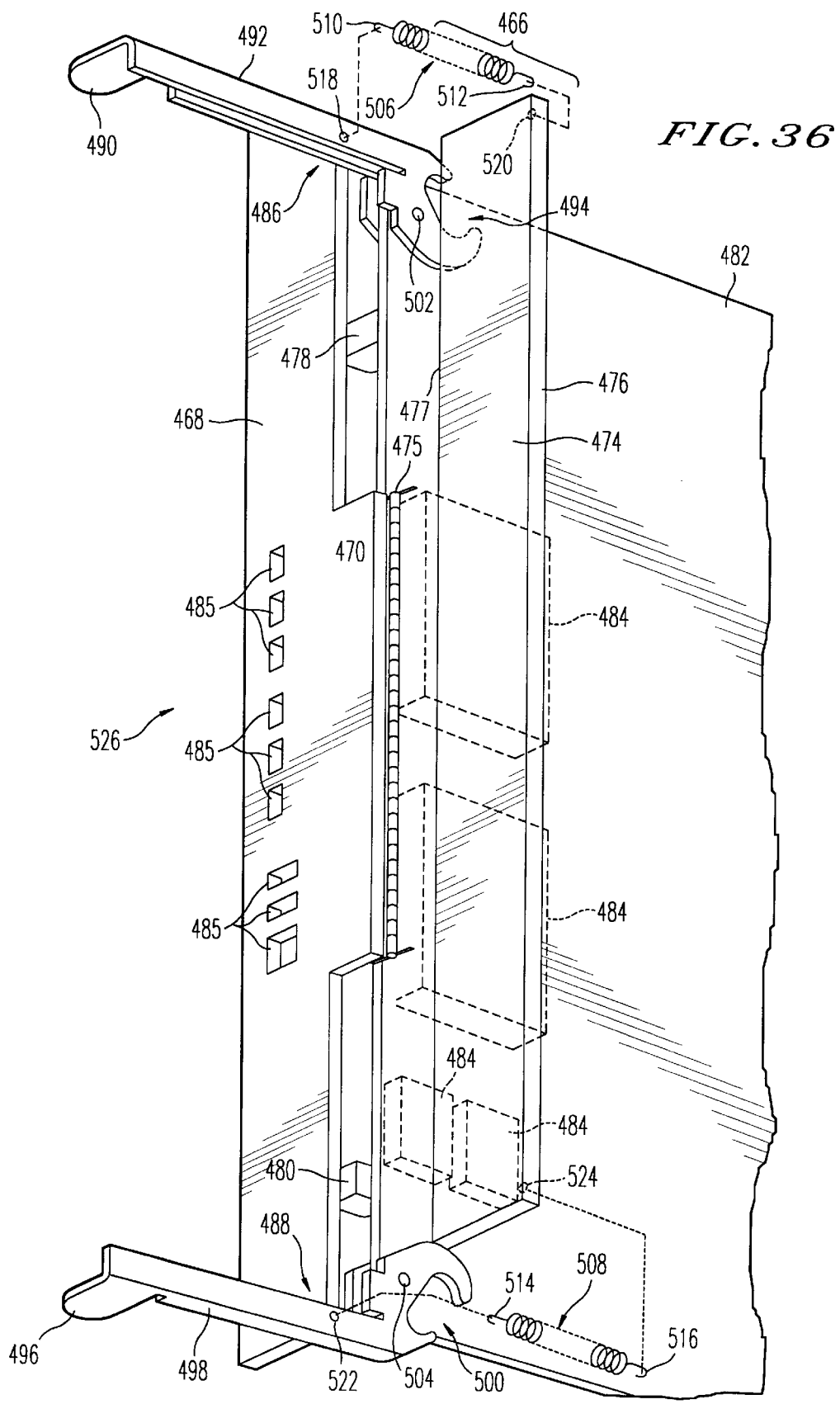
FIG. 36 is an exploded front perspective view of a faceplate assembly according to another embodiment of the present invention, attached to an electronic circuit card to form an electronic circuit card assembly.
Figure 37:
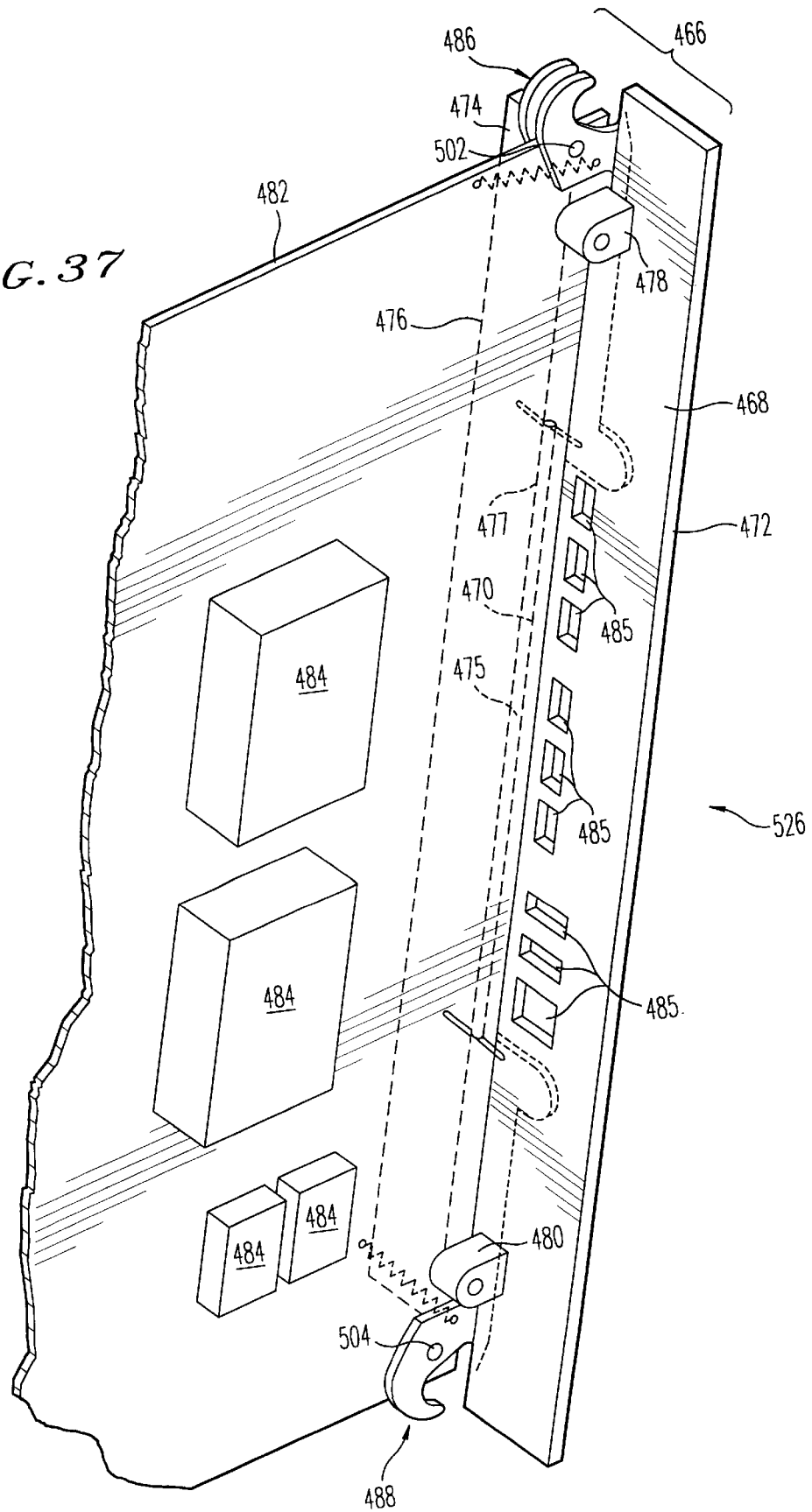
FIG. 37 is a rear perspective view of the electronic circuit card assembly shown in FIG. 20.

That is, as shown in FIGS. 36 and 37, faceplate assembly 466 includes a faceplate 468, which is similar to faceplates 101, 242 and 368 discussed above, and includes edges 470 and 472. A movable plate 474, made of material or materials similar to the movable plates discussed above, is pivotally mounted to the edge 470 of faceplate 468 by a hinge 475, which can include a spring therein as described in more detail below. Movable plate 474 includes edges 476 and 477 as shown. The faceplate assembly 466 includes mounting blocks 478 and 480 which mount faceplate 468 to an electronic circuit card 482 in a manner similar to, for example, mounting blocks 153 and 154 described above. Electronic circuit card 482 can be similar to, for example, electronic circuit card 150 described above, and includes electronic components 484 mounted thereon. The faceplate 468 includes openings 485 therein which provide access to certain components on circuit card 482 in a manner similar to, for example, openings 164 in faceplate 101 described above.

Faceplate assembly 466 further includes top and bottom latches 486 and 488, respectively, which are similar to, for example, top and bottom latches 134 and 136 described above, in that top latch 486 includes a tab 490, a shaft portion 492, and a pawl arrangement 494, and bottom latch 488 includes a tab 496, a shaft portion 498, and a pawl arrangement 500. Top and bottom latches 486 and 488 are pivotally mounted to circuit card 482 by pivot members 502 and 504, respectively, in a manner similar to that in which top and bottom latches 134 and 136 are mounted to electronic circuit card 150 as described above.

Faceplate assembly 466 further includes springs 506 and 508. Spring 506 has first and second ends 510 and 512, respectively, and spring 508 has first and second ends 514 and 516, respectively. The first end 510 of spring 506 is received into an opening 518 in top latch 486, the spring 506 passes under edge 477 of movable plate 474, and the second end 512 of spring 506 is received into an opening 520 which is on the side of movable plate opposite to that facing faceplate 468 and is proximate to edge 476 of movable plate 474. Similarly, the first end 514 of spring 508 is received into an opening 522 in bottom latch 488, the spring 508 passes under edge 477 of movable plate 474, and the second end 516 of spring 508 is received into an opening 524 which is in the side of movable plate opposite to that facing faceplate 468 and is proximate to edge 476 of movable plate 474. Accordingly, springs 506 and 508 couple top and bottom latches 486 and 488, respectively, to movable plate 474.

The faceplate assembly 466 coupled to circuit card 482 thus forms an electronic circuit card assembly 526. The electronic circuit card assembly 526 can be inserted into circuit card housing 214 as shown in FIG. 9 in a manner similar to that in which, for example, electronic circuit card assembly 152 is inserted as described above.

As discussed above, hinge 475, which couples movable plate 474 to faceplate 468, can include a spring which biases movable plate 474 in a position parallel or substantially parallel to faceplate 468, or at any suitable angle with respect to faceplate 468, as shown, for example, in FIG. 37.

Alternatively, a spring (not shown) external to hinge 475 can perform this biasing.

Figure 38:
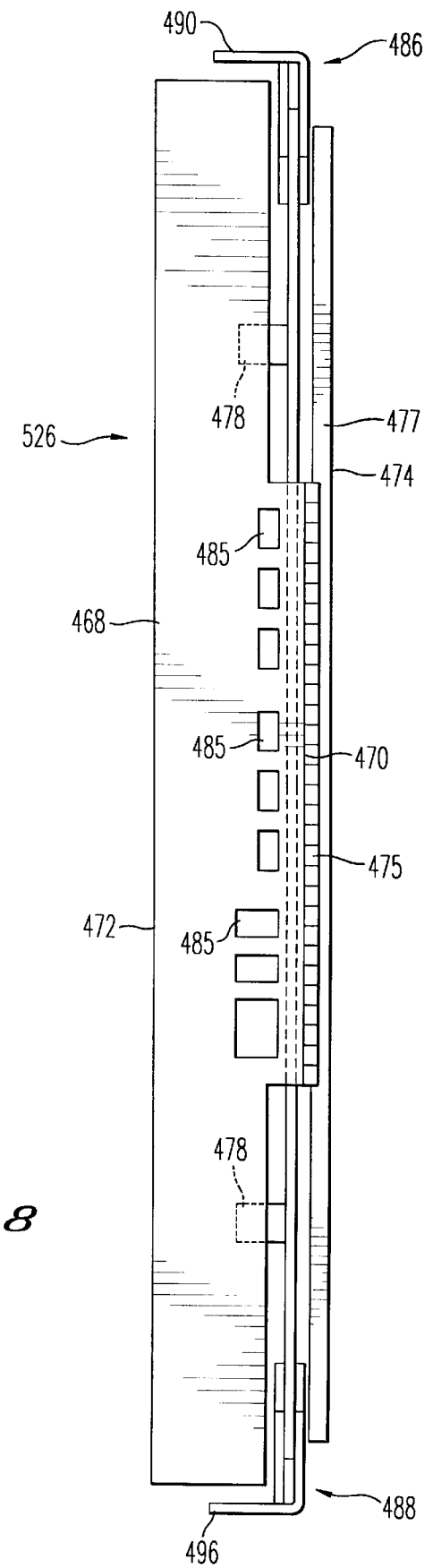
FIG. 38 is a front view of the electronic circuit card assembly shown in FIGS. 36 and 37 with the top and bottom latches of its faceplate assembly being in their unlatched positions.
Figure 39:
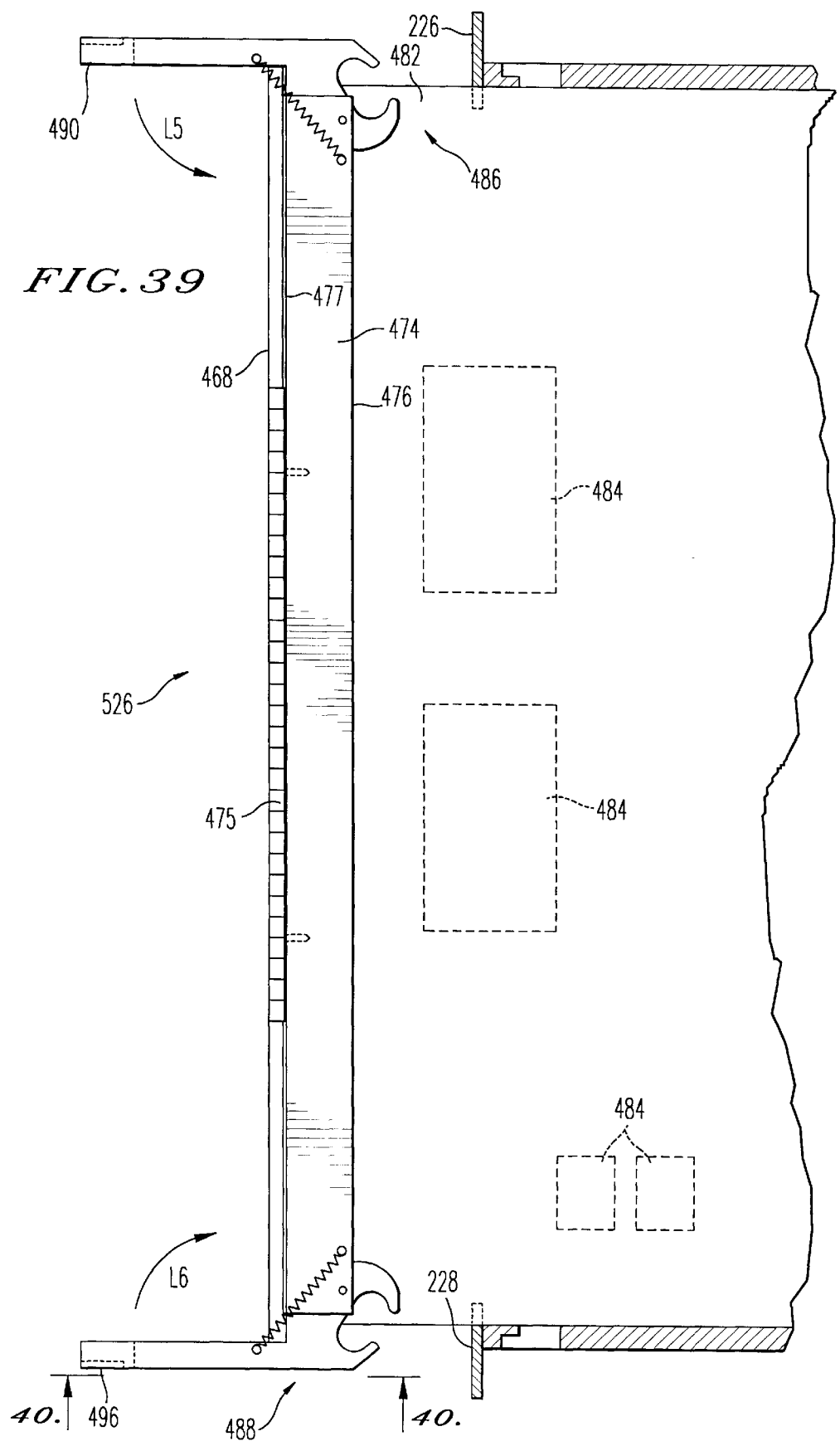
FIG. 39 is a plan view of the electronic circuit card assembly shown in FIGS. 36 and 37, taken from the side of the electronic circuit card on which components are mounted, with the latches of the faceplate assembly being positioned as shown in FIG. 38 for engagement with the top and bottom designator strips of the circuit card housing shown in FIG. 9.
Figure 40:
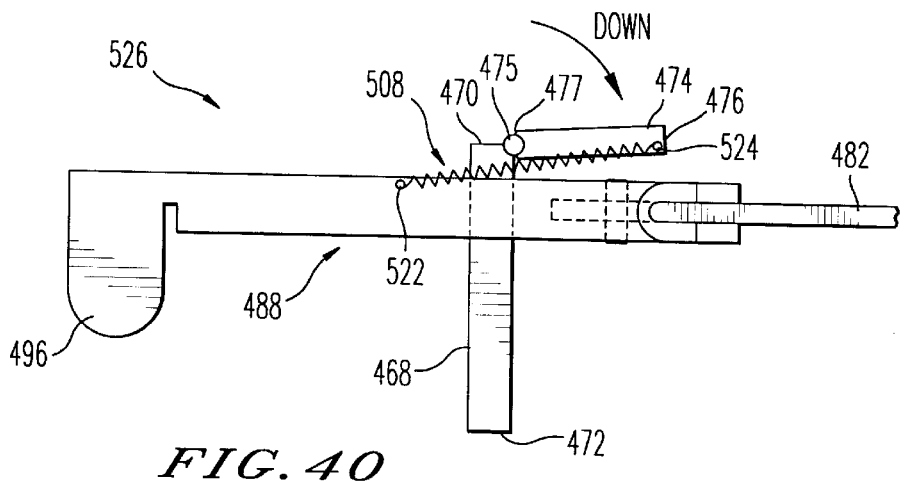
FIG. 40 is a end view of the electronic circuit card assembly as taken along lines 40—40 in FIG. 39.

When electronic circuit card assembly 526 is made ready for insertion into circuit card housing 214, top and bottom latches 486 and 488 are oriented as shown in FIGS. 38–40, with their shafts 492 and 498 extending perpendicularly or substantially perpendicularly to faceplate 468. When this occurs, springs 506 and 508 are pulled by top and bottom latches 486 and 488, respectively, and thus exert forces on movable plate 474 in opposition to the force exerted by the spring in hinge 475.

Accordingly, these forces pivot movable plate 474 about hinge 475 in the direction DOWN shown in FIG. 40, until the movable plate 474 reaches a position parallel to or substantially parallel to circuit card 482, or at any suitable angle with respect to circuit card 482. Therefore, when electronic circuit card assembly 526 is inserted into circuit card housing 214 in the manner described above with regard to, for example, circuit card assembly 152, the movable plate 474 will avoid contact with a faceplate of an adjacently inserted electronic circuit card assembly. It is also noted that the side of movable plate 474 now facing circuit card 482 can include a insulative material, such as rubber or the like, which prevents movable plate 474 from establishing any electrical contact with any circuit trace or component on circuit card 482, thus preventing unwanted short circuits caused by movable plate 474.

Figure 42:
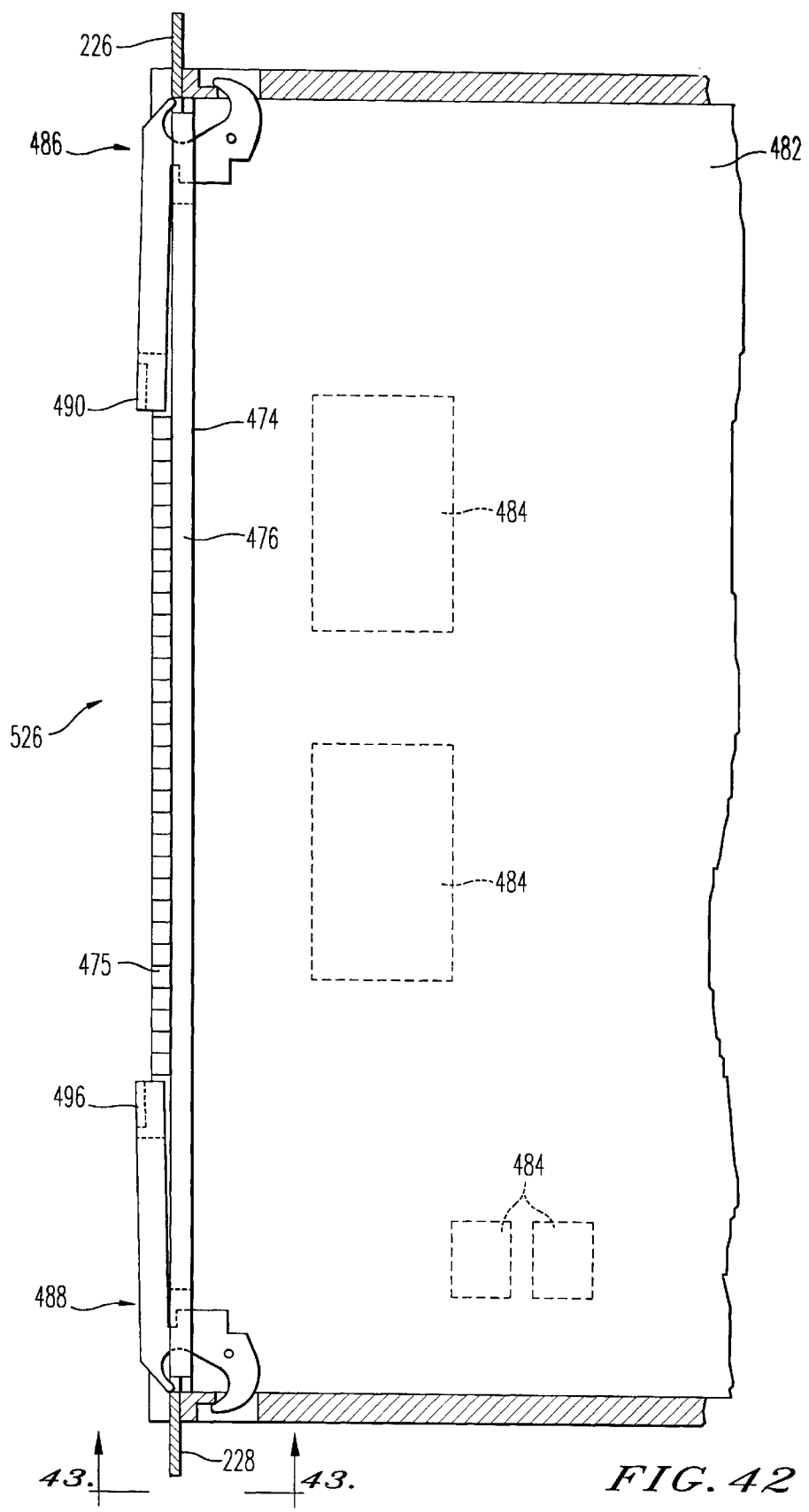
FIG. 42 is a plan view of the electronic circuit card assembly shown in FIGS. 36 and 37, taken from the side of the electronic circuit card on which components are mounted, with the latches of the faceplate assembly being positioned as shown in FIG. 41 and latching to the top and bottom designator strips of the circuit card housing shown in FIG. 9.

The electronic circuit card assembly 524 is slid into the circuit card housing 214 until faceplate 468 contacts designator strips 226 and 228 (see FIGS. 9 and 42). The top and bottom latches 482 and 488 engage with the designator strips 226 and 228, respectively, to latch the electronic card assembly 524 into the circuit card housing 214 in the manner similar to that described above with regard to electronic circuit card assembly 152.

Figure 43:
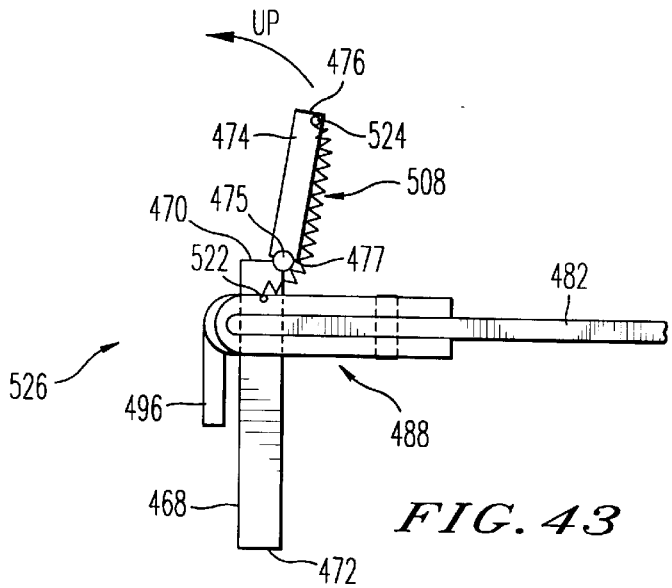
FIG. 43 is an end view of the electronic circuit card assembly taken along lines 43—43 in FIG. 42.
Figure 41:
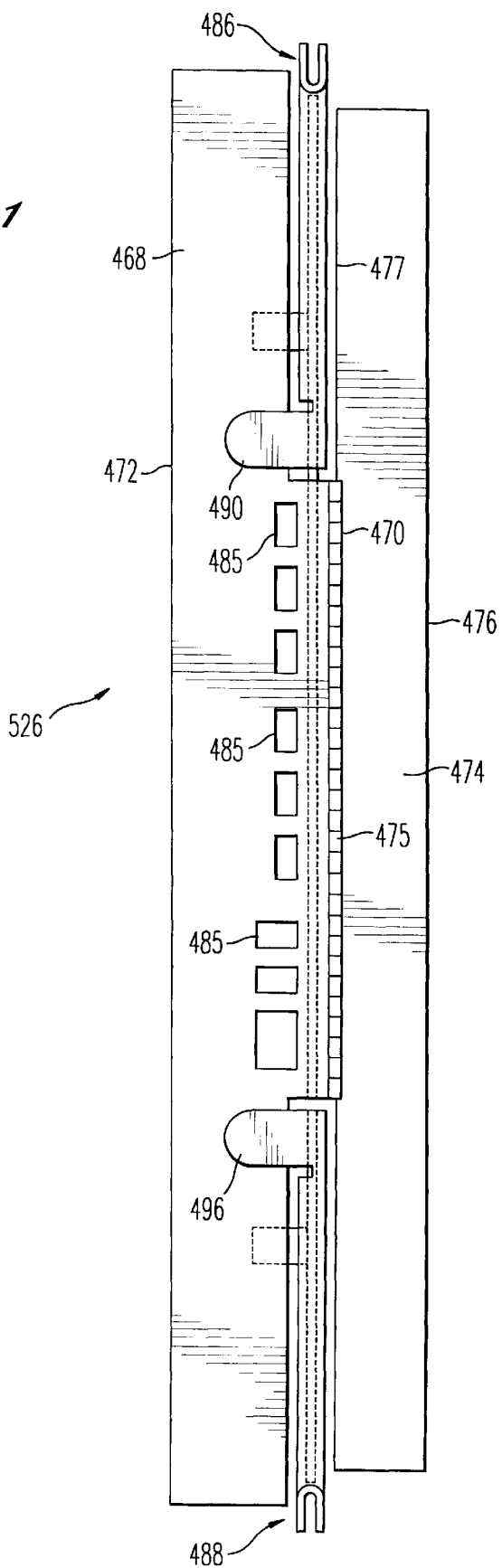
FIG. 41 is a front view of the electronic circuit card assembly as shown in FIGS. 36 and 37 with the top and bottom latches being in their latched positions.

That is, top and bottom latches 482 and 488 are moved in the direction indicated by arrows L5 and L6 in FIG. 39, until they assume the latched positions as shown in FIGS. 41–43. The positioning of the latches 482 and 488 in the latched positions allows springs 506 and 508 to relax and thus, the force exerted on movable plate 474 by the spring in hinge 474 is sufficient to overcome the forces imposed on movable plate 474 by springs 506 and 508. Accordingly, the force of the spring in hinge 475 pivots movable plate 474 about hinge 475 in the direction UP in FIG. 43 until movable plate 474 assumes a position parallel to or substantially parallel to faceplate 468, or at any other suitable angle with respect to faceplate 468.

Figure 44:
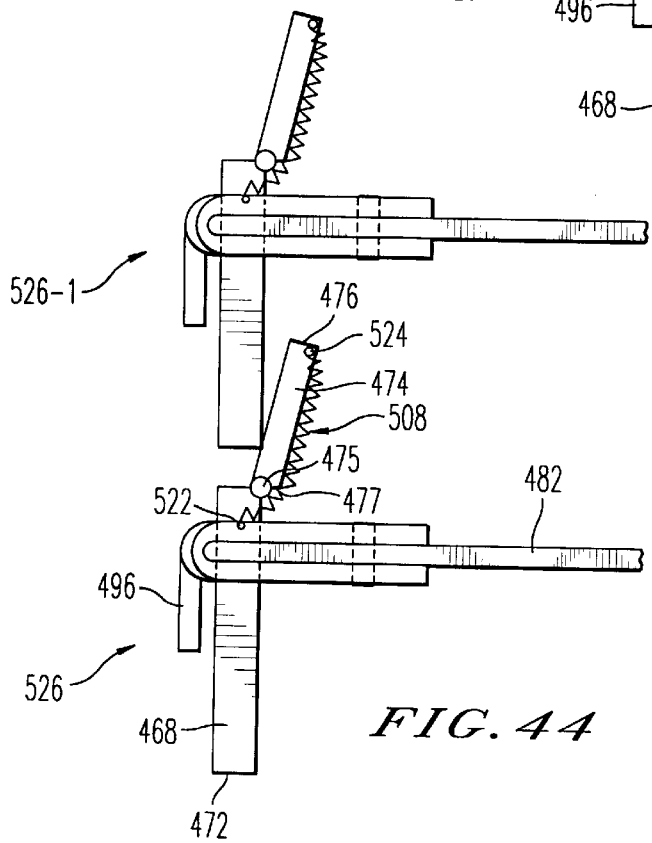
FIG. 44 is an end view of the electronic circuit card assembly shown in FIGS. 36 and 37 with the movable plate of its faceplate assembly engaged with a faceplate assembly of an electronic circuit card assembly adjacently inserted in a circuit card housing as shown in FIG. 9.

Therefore, as shown in FIG. 44, movable plate 474 in this position can contact the back side of a faceplate 468-1 of an electronic circuit card assembly 524-1 adjacently inserted in circuit card housing 214. Thus, movable plate 474 creates and electromagnetic shunt between faceplates 468 and 468-1 similar to those described above, which blocks or substantially blocks all EMI emissions between adjacent faceplates 468 and 468-1.

When the electronic circuit card assembly 524 is to be removed from circuit card housing 214, the top and bottom latches 482 and 488 are oriented as shown in FIGS. 38–40. This causes springs 506 and 508 to pivot movable plate 474 about hinge 475 in the direction DOWN in FIG. 40. Accordingly, movable plate 474 avoids contact with the adjacent faceplate 468-1 when the electronic circuit card assembly 524 is pulled out of circuit card housing 214.

Although the movable plate 474 is shown as being attached to edge 470 of faceplate 468, the faceplate assembly 466 can be configured such that movable plate 474 is attached to edge 472 of the faceplate 468 and operates in a manner similar to that described above. Furthermore, movable plate 474 need not be actuated by the movement of top and bottom latches 482 and 488, but rather, could be manually pivoted if desired. Also, the latch actuated movable faceplate 474 or manually actuated movable faceplate could be configured as any number of movable plates disposed along one edge of faceplate 468.

Although only a few exemplary embodiments of this invention have been described in detail above, those skilled in the art will readily appreciate that many modifications are possible in the exemplary embodiments without materially departing from the novel teachings and advantages of this invention. Accordingly all such modifications are intended to be included within the scope of this invention as defined in the following claims.

What is claimed is:

1. A faceplate assembly for use with an electronic circuit card, comprising:

a faceplate, having a surface and being adapted to mount to an electronic circuit card such that a component mounting surface of the electronic circuit card extends transversely to the surface of the faceplate, and having first and second opposite edges which each extend transversely to the surface of the faceplate; and a movable plate, having a plate edge and being movably coupled to the faceplate to move with respect to the faceplate between a first position, at which the plate edge is at a first distance from the second edge of the faceplate, and a second position, at which the plate edge is at a second distance from the second edge of the faceplate such that the plate edge extends beyond the second edge of the faceplate.

2. A faceplate assembly as claimed in claim 1, wherein:

the faceplate comprises a faceplate conductive portion and the movable plate comprises a movable plate conductive portion in electrical contact with the faceplate conductive portion.

3. A faceplate assembly as claimed in claim 1, further comprising:

an urging device, adapted to urge the movable plate toward one of the first position and the second position; and an actuating member, adapted to move the movable plate in a direction opposite to that in which the urging device urges the movable plate.

4. A faceplate assembly as claimed in claim 3, wherein:

the urging device urges the movable plate toward the first position; and the actuating member moves the movable plate toward the second position.

5. A faceplate assembly as claimed in claim 3, wherein:

the urging device urges the movable plate toward the second position; and the actuating member moves the movable plate toward the first position.

6. A faceplate assembly as claimed in claim 3, wherein:

the urging device is a spring, coupled to the faceplate and movable plate.

7. A faceplate assembly as claimed in claim 3, wherein:

the actuating member comprises a wedge arrangement which is adapted to move the movable plate.

8. A faceplate assembly as claimed in claim 1, wherein:

the movable plate is mechanically coupled to a latch which is adapted to latch the circuit card in a circuit card housing, such that movement of the movable plate between the first and second positions is actuated by movement of the latch member.

9. A faceplate assembly as claimed in claim 1, wherein:
the movable plate is slidably coupled to the faceplate to slide with respect to the faceplate between the first and second positions.

10. A faceplate assembly as claimed in claim 1, wherein:
the movable plate is pivotally coupled to the faceplate about a pivot axis to pivot between the first and second positions.

11. A faceplate assembly as claimed in claim 10, wherein:
the pivot axis is transverse to the surface of the faceplate.

12. A faceplate assembly as claimed in claim 10, wherein:
the pivot axis extends in substantially the same direction as one of the first and second edges of the faceplate.

13. A faceplate assembly as claimed in claim 1, wherein:
the first edge of the faceplate includes an opening therein, adapted to receive a portion of the movable plate therein when the movable plate is in the first position, the portion being outside the opening when the movable plate is in the second position.

14. An electronic circuit card, adapted to load into a circuit card housing, the electronic circuit card including a faceplate assembly, comprising:
a faceplate having a conductive portion; and,
a movable plate, having a conductive portion in electrical contact with the conductive portion of the faceplate, and being movably coupled to the faceplate to move with respect to the faceplate between a first position, at which the movable plate is adapted to avoid contact with another faceplate assembly of an electronic circuit card adjacently inserted in the circuit card housing, and a second position, at which the movable plate extends beyond an edge of the faceplate and is adapted to contact said another faceplate assembly of the adjacently inserted electronic circuit card.

15. An electronic circuit card as claimed in claim 14, further comprising:
an urging device, adapted to urge the movable plate toward one of the first position and the second position; and
an actuating member, adapted to move the movable plate in a direction opposite to that in which the urging device urges the movable plate.

16. An electronic circuit card as claimed in claim 14, further comprising:
a latch member, adapted to move between a latched position at which the latch member secures the electronic circuit card in the circuit card housing, and an unlatched position in which the latch member releases the electronic circuit card from the circuit card housing;
the latch member positioning the movable plate at the first position in the unlatched position, and positioning the movable plate at the second position in the latched position.

17. An electronic circuit card as claimed in claim 14, further comprising:
a pivot member which pivotally couples the movable plate to the faceplate to pivot between the first and second positions.

18. An electronic circuit card as claimed in claim 14, wherein:
the movable plate is slidably coupled to the faceplate to slide between the first and second positions.

19. An electronic circuit card as claimed in claim 14, wherein:
the edge of the faceplate has an opening therein, adapted to receive a portion of the movable plate therein when the movable plate is in the first position, the portion being outside the first opening when the movable plate is in the second position.

20. A method of reducing emission of electromagnetic energy through openings between adjacent electronic circuit cards inserted in an electronic circuit card housing, each of the electronic circuit cards comprising faceplate assembly having a faceplate, comprising an electrically conductive portion, and a movable plate, comprising an electrically conductive portion and being movably coupled to the faceplate, the method comprising the steps of:
insertion a plurality of the electronic circuit cards in series into the electronic circuit card housing; and
moving the movable plate of the faceplate assembly of at least one of the electronic circuit cards into electrical contact with the faceplate assembly of its adjacent electronic circuit card so that the movable plate acts as an electroconductive shunt between the adjacent faceplate assemblies.

21. A method as claimed in claim 20, wherein:
at least one of the electronic circuit cards comprises a latch which is mechanically coupled to the movable plate of its respective electronic circuit card and positionable in latched and unlatched positions; and
the moving step comprise the step of:
positioning the latch in the latched position to latch its respective electronic circuit card into the electronic circuit card housing and move the movable plate of the faceplate assembly of its respective electronic circuit card into electrical contact with the faceplate assembly of the adjacent electronic circuit card.

22. A method as claimed in claim 21, further comprising the steps of:
positioning the latch in the unlatched position to release its respective electronic circuit card from the electronic circuit card housing and move the movable plate of the faceplate assembly of its respective electronic circuit card out of contact with the faceplate assembly of the adjacent electronic circuit card; and
removing the respective electronic circuit card from the electronic circuit card housing.

23. A method as claimed in claim 20, further comprising the step of:
imposing an urging force on the movable plate of the faceplate assembly of at least one of the electronic circuit cards; and
wherein the moving step comprises the step of applying a force to the movable plate in opposition of the urging force to move the movable plate.

24. A method as claimed in claim 20, further comprising the steps of:
imposing an urging force on the movable plate of the faceplate assembly of at least one of the electronic circuit cards; and
applying a restrictive force to the movable plate to prevent the urging force from moving the movable plate; and
wherein the moving step comprises the step of removing the restrictive force to permit the urging force to move the movable plate.

25. A method as claimed in claim 20, wherein:
the moving step comprises the step of pivoting the movable plate of the faceplate assembly of at least one of the electronic circuit cards about a respective pivot point.

* * * * *